(12) United States Patent
Zagdoun et al.

(10) Patent No.: US 8,697,186 B2
(45) Date of Patent: Apr. 15, 2014

(54) METHOD FOR MANUFACTURING A MASK HAVING SUBMILLIMETRIC APERTURES FOR A SUBMILLIMETRIC ELECTRICALLY CONDUCTIVE GRID, AND MASK AND SUBMILLIMETRIC ELECTRICALLY CONDUCTIVE GRID

(75) Inventors: Georges Zagdoun, La Garenne Columbes (FR); Bernard Nghiem, Arsy (FR); Emmanuel Valentin, Le Plessis Trevise (FR); Svetoslav Tchakarov, Sceaux (FR)

(73) Assignee: Saint-Gobain Glass France, Courbevoie (FR)

( * ) Notice: Subject to any disclaimer, the term of this patent is extended or adjusted under 35 U.S.C. 154(b) by 89 days.

(21) Appl. No.: 13/120,292

(22) PCT Filed: Sep. 24, 2009

(86) PCT No.: PCT/FR2009/051816
§ 371 (c)(1),
(2), (4) Date: Jun. 24, 2011

(87) PCT Pub. No.: WO2010/034945
PCT Pub. Date: Apr. 1, 2010

(65) Prior Publication Data
US 2011/0250387 A1 Oct. 13, 2011

(30) Foreign Application Priority Data
Sep. 24, 2008 (FR) ...................................... 08 56429

(51) Int. Cl.
*B05D 5/00* (2006.01)
(52) U.S. Cl.
USPC .......... 427/257; 427/98.4; 427/203; 427/258; 427/259
(58) Field of Classification Search
None
See application file for complete search history.

(56) References Cited

U.S. PATENT DOCUMENTS 4,435,047 A 3/1984 Fergason
(Continued)

FOREIGN PATENT DOCUMENTS

EP 0 238 164 9/1987
EP 1 610 940 1/2006
(Continued)

OTHER PUBLICATIONS

International Search Report as issued for PCT/FR2009/051816, dated Feb. 18, 2010.
(Continued)

*Primary Examiner* — Timothy Meeks
*Assistant Examiner* — Michael P. Rodriguez
(74) *Attorney, Agent, or Firm* — Pillsbury Winthrop Shaw Pittman LLP

(57) ABSTRACT

A process for manufacturing a mask having submillimetric openings, in which: for a masking layer, a first solution of colloidal nanoparticles in a first solvent is deposited, the particles having a given glass transition temperature $T_g$, the drying of the masking layer, known as the first masking layer, is carried out at a temperature below said temperature $T_g$ until a mask having a two-dimensional network of substantially straight-edged submillimetric openings, that defines a mask zone known as a network mask zone is obtained, a solid mask zone is formed by a liquid deposition, on the face, of a second masking zone, the solid mask zone being adjacent to and in contact with the network mask zone, and/or at least one cover zone is formed, the cover zone being in contact with the network mask zone, and/or after the drying of the first masking layer, a filled mask zone is formed by filling, via a liquid route, openings of a portion of the network mask zone. The invention also relates to the mask and the electroconductive grid obtained.

23 Claims, 10 Drawing Sheets

(56) References Cited

U.S. PATENT DOCUMENTS

| | | | |
|---|---|---|---|
| 4,732,456 A | 3/1988 | Fergason et al. | |
| 4,806,922 A | 2/1989 | McLaughlin et al. | |
| 5,453,459 A | 9/1995 | Roberts | |
| 5,866,199 A | 2/1999 | Swidler et al. | |
| 7,172,822 B2 | 2/2007 | Shibata | |
| 2004/0150326 A1* | 8/2004 | Shibata | 313/503 |
| 2005/0059766 A1* | 3/2005 | Jones et al. | 524/431 |

FOREIGN PATENT DOCUMENTS

| | | |
|---|---|---|
| FR | 2 924 274 | 5/2009 |
| WO | WO 92/19695 | 11/1992 |
| WO | WO 00/50354 | 8/2000 |
| WO | WO 2004/015739 | 2/2004 |
| WO | WO 2004/085135 | 10/2004 |
| WO | WO 2006/090086 | 8/2006 |
| WO | WO 2007/023237 | 3/2007 |
| WO | WO 2007/042689 | 4/2007 |
| WO | WO 2008/023124 | 2/2008 |
| WO | WO 2008/132397 | 11/2008 |

OTHER PUBLICATIONS

Adelung, et al., "Strain-controlled growth of nanowires within thin-film cracks", Nature Materials, Nature Publishing Group, vol. 3, Jun. 2004, pp. 375-379.

International Preliminary Report on Patentability, including the Written Opinion dated Feb. 18, 2010, as issued for PCT/FR2009/051816, dated May 31, 2011.

* cited by examiner

METHOD FOR MANUFACTURING A MASK HAVING SUBMILLIMETRIC APERTURES FOR A SUBMILLIMETRIC ELECTRICALLY CONDUCTIVE GRID, AND MASK AND SUBMILLIMETRIC ELECTRICALLY CONDUCTIVE GRID

CROSS-REFERENCE TO RELATED APPLICATIONS

This application is the U.S. National Stage of PCT/FR2009/051816, filed Sep. 24, 2009, which in turn claims priority to French Application No. 0856429, filed Sep. 24, 2008. The content of both applications are incorporated herein by reference in their entirety.

FIELD

The present invention relates to a process for manufacturing a mask having submillimetric openings in order to produce a submillimetric electroconductive grid, to such a mask, and to the grid thus obtained.

BACKGROUND

Manufacturing techniques are known that make it possible to obtain micron-sized metal grids. These have the advantage of attaining surface resistances of less than 1 ohm/square while retaining a light transmission ($T_L$) of around 75 to 85%. However, their production process is based on a technique of etching a metal layer via a photolithographic process resulting in a high manufacturing cost that is incompatible with the envisioned applications.

Document U.S. Pat. No. 7,172,822 itself describes the production of an irregular network conductor that is based on the use of a cracked silica sol-gel mask. In the examples carried out, a sol based on water, alcohol and a silica precursor (TEOS) was deposited, the solvent was evaporated and it was annealed at 120° C. for 30 minutes in order to form the 0.4 μm thick cracked sol-gel mask.

FIG. 3 from this document U.S. Pat. No. 7,172,822 reveals the morphology of the silica sol-gel mask. It appears in the form of fine crack lines oriented along a preferred direction, with bifurcations characteristic of the fracture phenomenon of an elastic material. These main crack lines are occasionally joined together by the bifurcations.

The domains between the crack lines are asymmetric with two characteristic dimensions: one parallel to the crack propagation direction between 0.8 and 1 mm, the other perpendicular between 100 and 200 μm.

This process for manufacturing an electrode by cracking of the sol-gel mask admittedly constitutes progress for the manufacture of a network conductor by eliminating, for example, recourse to photolithography (exposure of a resist to radiation/a beam and development), but may still be improved, especially in order to be compatible with industrial requirements (reliability, simplification and/or reduction of the manufacturing steps, reduced cost, etc.).

It can also be observed that this manufacturing process inevitably requires the deposition of a (chemically or physically) modifiable sublayer at the openings in order either to allow a favored adhesion (of metal colloids for example) or else to allow catalyst grafting for metal postgrowth, this sublayer therefore having a functional role in the growth process of the network.

Furthermore, the profile of the cracks is V-shaped due to the fracture mechanics of the elastic material, thus entailing the use of a post-mask process in order to make the metallic network grow starting from colloidal particles located at the base of the V.

Furthermore, both the electrical and/or optical properties of this irregular network electrode and the connection system and/or other connected functions can be improved.

SUMMARY

The present invention therefore aims to overcome the drawbacks of the prior art processes by proposing a process for manufacturing an electroconductive grid having at least one submillimetric characteristic dimension (at least for the width of strands A' or even the spacing between strands B') in particular in electrical contact with at least one electric power supply component.

This process should be simple, economical, in particular free of (photo)lithography step(s), flexible (suitable in particular regardless of the connection system design), and be able to be carried out even over large surface areas.

The optical and/or electrical conductivity properties of the grid should moreover be at least comparable to those of the prior art.

For this purpose, a first subject of the invention is a process for manufacturing a mask having submillimetric openings, in particular micron-scale openings (at least for the width of the openings), for a submillimetric electroconductive grid, mask on a main face of a substrate, in particular that is transparent and/or flat, by depositing a liquid masking layer as a given solution and drying, in which process:

for said masking layer, a first solution of colloidal nanoparticles stabilized and dispersed in a first solvent is deposited, the nanoparticles having a given glass transition temperature $T_g$;

said drying of the masking layer, known as the first masking layer, is carried out at a temperature below said temperature $T_g$ until a mask having a two-dimensional network of submillimetric openings, referred to as a network mask, is obtained with substantially straight mask area edges, the network mask being in a zone referred to as a network mask zone, and the process comprising, in addition, the formation of a solid mask zone via a liquid deposition, on the face, of a second masking layer, the solid mask zone being adjacent to and in contact with the network mask zone, and/or the process comprises the formation of at least one cover zone via the placement of at least one cover on the face, the cover zone being in contact with the network mask zone, and/or after the drying of the first masking layer, the process comprises the formation of a filled mask zone via the liquid filling (especially partial, over a fraction of the thickness) of the openings of a portion of the network mask zone, or even the covering, by liquid deposition, of the openings of a portion of the network mask zone.

The mask having a network of openings according to the invention and its manufacturing method according to the invention firstly have a certain number of advantages.

By virtue of the process according to the invention, a mesh of openings is formed, which openings may be distributed over the entire masking surface and make it possible to obtain isotropic properties.

The network of openings has substantially more interconnections than the cracked silica sol-gel mask of the prior art.

The mask having a network of openings has a random aperiodic structure in at least one characteristic direction of the network (therefore parallel to the surface of the substrate), or even in two (all) directions.

In order to obtain the substantially straight edges, it is necessary to both:
- choose particles of limited size, therefore nanoparticles, in order to promote their dispersion, preferably with at least one characteristic (mean) dimension, for example the mean diameter, between 10 and 300 nm, or even between 50 and 150 nm; and
- stabilize the nanoparticles in the solvent (especially by treatment via surface charges, for example via a surfactant, by control of the pH), to prevent them from agglomerating together, from precipitating and/or from falling due to gravity.

In addition, the concentration of the nanoparticles is adjusted, preferably between 5%, or even 10% and 60% by weight, more preferably still between 20% and 40%. The addition of binder is avoided (or it is added in a small enough amount so as not to influence the mask).

Drying causes a contraction of the first masking layer and friction of the nanoparticles at the surface resulting in a tensile stress in the layer which, via relaxation, forms the openings.

Drying results, in one step, in the elimination of the solvent and in the formation of the openings.

After drying, a stack of nanoparticles is thus obtained, in the form of clusters of variable size that are separated by the openings that are themselves of variable size. The nanoparticles remain discernible even if they may aggregate. The nanoparticles are not melted to form a continuous layer.

The drying is carried out at a temperature below the glass transition temperature for the creation of the network of openings. Indeed, it has been observed that above this glass transition temperature, a continuous layer or at the very least a layer without openings through the entire thickness was formed.

Thus, a weakly adherent layer simply composed of a stack of (hard), preferably spherical nanoparticles is deposited on the substrate. These hard nanoparticles do not establish strong chemical bonds, either between themselves or with the surface of the substrate. The cohesion of the layer is provided all the same by weak forces, of the van der Waals forces or electrostatic forces type.

The mask obtained is capable of easily being eliminated using cold or warm pure water, in particular with an aqueous solvent, without requiring highly basic solutions or potentially polluting organic compounds. Therefore, preferably, the solvent is preferably water-based, or even entirely aqueous.

By choosing a high enough $T_g$ for the nanoparticles of the first solution, the drying step (and preferably also the deposition step) may be carried out (substantially) at a temperature below 50° C., preferably at ambient temperature, typically between 20° and 25° C. Thus, unlike the sol-gel mask, annealing is not necessary.

The difference between the given glass transition temperature $T_g$ of the particles of the first solution and the drying temperature preferably being greater than 10° C., or even 20° C.

The drying step of the first layer may be carried out substantially at atmospheric pressure rather than drying under vacuum for example.

It is possible to modify the drying parameters (control parameters), especially the degree of humidity and the drying rate, in order to adjust the distance between the openings B, the size of the openings A, and/or the B/A ratio.

The higher the humidity is (all things otherwise being equal), the lower A is.

The higher the temperature is (all things otherwise being equal), the higher B is.

It is possible to deposit the first solution (aqueous or non-aqueous) of colloids via a standard liquid technique.

As wet techniques, mention is made of:
- spin coating;
- curtain coating;
- dip coating;
- spray coating; and
- flow coating.

In a first embodiment, the first solution comprises polymeric nanoparticles and preferably the solvent is water-based, or even entirely aqueous.

For example, acrylic copolymers, styrenes, polystyrenes, poly(meth)acrylates, polyesters or blends thereof are chosen.

The masking layer (before drying) may thus be essentially composed of a stack of colloidal nanoparticles (therefore nanoparticles of a material that is insoluble in the solvent) that are discernible and in particular are polymeric.

The polymeric nanoparticles may preferably be composed of a solid, water-insoluble polymer.

The expression "essentially composed" is understood to mean that the masking layer may optionally comprise other compounds, as traces, which do not have an influence on the properties of the mask (formation of the network, easy removal, etc.).

The first colloidal aqueous solution is preferably composed of water and of polymeric colloidal particles, to the exclusion therefore of any other chemical agent (such as, for example, pigments, binders, plasticizers, etc.). Likewise, the colloidal aqueous dispersion is preferably the only compound used to form the mask.

Unlike a silica sol-gel, the first solution is naturally stable, with nanoparticles already formed. The first solution preferably contains no (or a negligible amount of) reactive element of polymer precursor type.

The network mask (after drying) may thus be essentially composed of a stack of nanoparticles, preferably polymeric, discernible nanoparticles. The polymeric nanoparticles are composed of a solid, water-insoluble polymer.

The first solution may comprise, alternatively or cumulatively, inorganic nanoparticles, preferably of silica, alumina or iron oxide.

Owing to the additional masking, the process according to the invention thus makes it possible to form one or more solid zones, in the zones intended to be electrically insulating.

These zones may have various functions described below:
- separating zone, for separating the grid zone into at least two grid regions, for example for adapting the heating power of a heating grid, or else for forming several electrodes;
- separating zone between the grid and the connection system of the upper electrode;
- communication window in order to pass information; and
- demargination zone for preventing grounding, for protecting from corrosion.

Therefore, the formation of an electrically insulating zone in contact with the grid is rendered possible at the stage of manufacture of the grid and not subsequent to the manufacture of the grid or of the complete device integrating the grid.

Indeed, in a conventional electrically controllable device, with a heating electroconductive coating, heating zones are generally created by chemical etching or by laser attack of the continuous coating.

And, in an electrically controllable device in particular of OLED type, with an electroconductive grid acting as lower electrode (electrode closest to the substrate), it is common to separate the busbar for the upper electrode by chemical attack of the electroconductive layer typically made of ITO.

Naturally, with the process according to the invention, it is also possible to choose the design of solid zone (by cover, by filling, by layer) to order, by delimiting the deposition zone or zones for the grid and the solid zone or zones, to protect from the electroconductive deposition.

Via the filling and/or liquid deposition of layer, and/or via the cover (that is to say an added solid mask), it is possible to form:

at least one solid strip (that is linear, curved) or a plurality of solid strips (that are parallel, of constant gap, etc.), in particular located at the edge of the grid region, strip(s) that preferably open onto one (and the same) grid edge; and/or a plurality of solid geometric patterns (that are individual, round, arranged in a periodic or aperiodic network, etc.) especially inside the grid zone, or on a marginal zone.

The formation of fine solid (or filled) patterns, for example having a width of less than 500 μm, for example less than or equal to 250 μm, is very particularly sought.

The filling layer such as the second masking layer is not cracked, or at the very least not cracked over the entire depth.

Like the network mask alone, the second masking layer and/or the filled mask may have a mechanical strength that is low enough in order to be removed (if necessary) without damaging the substrate, nor the connection system nor the grid, but remains high enough to withstand the deposition of the electroconductive grid material and to form a barrier thereto.

Naturally, during the formation of the filled mask zone, the liquid deposition may cover the network mask. For the solid formation zone or the filled, or even covered, mask zone it is possible to deposit a paste loaded with particles, in particular mineral, micron-scale particles. The particles may be, for example, metal oxides such as alumina, $TiO_2$ or $BaTiO_3$.

The paste is not consolidated by a heat treatment. For example, it may comprise glass frit, or any uncrosslinked organic or inorganic binder.

The paste may preferably be soluble in water or in alcohol, especially dilute alcohol (for example isopropanol at 20% and water at 35%).

It is possible to deposit the paste by any known printing technique, for example screen printing, which allows a satisfactory resolution.

For the solid zone, a peelable adhesive polymer film deposited in the solid state could be used (such as for example those described in application EP-A-1 610 940). Deposition in the solid state however requires a relatively complex deposition installation. Moreover, the peeling step is often quite long and fastidious and may leave traces of adhesives on the surface of the substrate.

For the filled zone, a material could be deposited by a solid route (powder, etc.) or by CVD or PVD. Once again, the deposition in the solid state however requires a relatively complex and/or costly deposition installation. Thus, the invention favors the use of liquid deposition(s).

For the solid zone, it is possible to use a polymer film.

In a first example, peelable adhesive polymer films formed by a liquid route are chosen which were hitherto known as surface (transport, etc.) protective films.

As illustrated, for example, by patent U.S. Pat. No. 5,866, 199, a solution of polymers is deposited on a glass (in particular a solution of vinyl copolymer), giving, after reaction, a continuous film that adheres to the glass and that can be removed by peeling.

Application US 2002/0176988 also describes the deposition of aqueous dispersions of polymers, which form peelable protective films (in particular described in example 3).

Other peelable films are sold, including:

solvent phase blue ink 420S sold by APCIS, that can be applied by screen printing, with a brush or with a spray gun;

solvent-free Plastisol peelable varnish 140-60044/27 that can be applied by screen printing, with polymerization at 160-180° C. in a few minutes, or that is water-soluble during treatment at 200° C.;

peelable (and water-soluble) varnish 140-20004 PRINT COLOR, sold by APCIS, that can be applied by screen printing;

water-resistant peelable varnish AQAPEEL 550 which is a polycarbonate-based polyurethane varnish; and peelable varnish based on modified vinyl resin from KHANTI CORROSION.

In a second example, polymer films are chosen that are obtained from a liquid phase and that can be removed by cleaning using aqueous solutions. This film is removed with water, preferably at the same time as the network mask.

Such films have also been developed as protective films until now. Application US 2002/0176988 describes, for example, the deposition of aqueous solutions of various polymers, which form protective films that can be removed by washing with water. Generally, the films obtained from aqueous solutions of polymers (for example of polyvinyl alcohol or of polyethylene oxide as described in the aforementioned application US 2002/0176988, or of acrylics such as in application WO 00/50354) can easily be removed with water, since the polymer is itself soluble in water.

Other water-soluble films are sold, including:

product LAB-N210350:60 sold by Coates Screen Inks GmbH;

water-soluble varnish 140-20004 PRINT COLOR, sold by APCIS, that can be applied by screen printing;

Ultraglass UVGL and Ultraglass UVGO products sold by Marabu;

Lascaux Screen Filler and Lascaux Screen Painting Fluid products sold by Lascaux Lift Solution; and POLIGEN ES9101018, ES 91022 and ES91025 products sold by BASF/BTC.

Moreover, films exist that are obtained from aqueous dispersions, therefore of water-insoluble polymers, which require the use of basic solutions (for example based on ammonium hydroxide as also described in application US 2002/0176988) or of special detergents and organic products that will detach the film from the surface of the glass before cleaning with water (as described in U.S. Pat. No. 5,453,459). These solutions or detergents have to be handled carefully and/or are relatively harmful to the environment and are not therefore used for the invention.

Similarly, the removal of a sol-gel mask, conventionally carried out by a very basic solution, is capable of deteriorating the grid and/or the subjacent surface.

Therefore, for the solid formation zone, it is possible to form a peelable polymer film or else a soluble polymer film by depositing an aqueous solution of dissolved polymer (and not a dispersion), such as for example those mentioned above, in particular based on polyvinyl alcohol. Said soluble polymeric film is then removed by washing with an aqueous solution.

In order to form the filled zone, it is also possible to fill the openings of the network mask with an aforementioned polymeric dispersion or solution that gives a peelable adhesive film, or else to deposit through the openings a polymeric solution of dissolved polymers, especially based on polyvinyl alcohol, the filled mask then being removed by washing with an aqueous solution, and the first solution then being chosen to be (essentially) aqueous.

Preferably, it is sought to develop a mask deposited via a liquid route (for the solid or filled zone) with sufficient resistance to the electroconductive deposition but which can be removed using pure water.

For the solid formation zone or the filled mask zone, it may thus be preferred to deposit a solution of colloidal nanoparticles that are stabilized and dispersed in a preferably aqueous solvent, the nanoparticles (made of at least one material that is solid and insoluble in the solvent) having a given glass transition temperature $T_g$ and the second masking layer or the filled zone being dried at a temperature greater than said temperature $T_g$ and preferably less than or equal to 50° C.

Like the first masking layer, the second masking layer and/or the filling material may thus be essentially composed of a stack of colloidal particles (therefore of nanoparticles of a material that is insoluble in the solvent) that are discernible and in particular polymeric. The polymeric nanoparticles are composed of a solid polymer that is insoluble in water.

The expression "essentially composed" is understood to mean that the second masking and/or filling layer may optionally comprise other compounds, as traces, which do not influence the properties of the mask (formation of the network, easy removal, etc.).

Like the first masking layer, the colloidal aqueous solution for the second masking and/or filling layer is preferably composed of water and of polymeric colloidal particles, to the exclusion therefore of any other chemical agent (such as for example pigments, binders, plasticizers, etc.). Similarly, the colloidal aqueous dispersion is preferably the only compound used in order to form the mask.

The second masking and/or filling layer are dried at a temperature above the glass transition temperature $T_g$ of the polymer so as to obtain a continuous layer. As already indicated, it has indeed been observed that below this glass transition temperature the drying was accompanied by the creation of openings, destroying the continuous nature of the masking layer.

The second masking and/or filling layer based on polymeric nanoparticles are preferably dried at a temperature of at most 70° C., or even 50° C. so as to more easily keep clearly discernible particles, which do not coalesce together at the time of drying. Indeed, too high a temperature risks creating a film constituted no longer of small discernible hard spheres but of particles bonded together, to the detriment of the ease of subsequent elimination.

The second masking and/or filling layer are preferably dried at a temperature close to ambient temperature or at a slightly higher temperature, for example between 25 and 35° C. Preferably, no heating means (such as for example infrared lamps) and/or no forced drying means, such as systems of ventilation, of blowing hot or cold air, is used, with the exception optionally of mild drying means (at temperatures slightly above ambient temperature), which means may make use of a hot air drying or a few infrared lamps.

Indeed, too long or too strong a heating or drying risks forming films in which the polymer particles will no longer be discernible, but will be bonded together, partly or even completely melted, the films obtained then being difficult to remove. Forced drying or heating means are most of the time pointless since it has been observed that the layers could be dried very naturally in a few minutes, typically less than 3 minutes, or even less than 2 minutes.

The films obtained from aqueous dispersions of polymers that are insoluble in water (and not from a colloidal solution) have, on the other hand, quite a high cohesion, probably due to chemical polymerization reactions or phenomena of partial melting and bonding of the particles, which requires the use of basic solutions or of special organic products.

Generally, it is preferred that the shape and size of the colloidal particles of the second masking and/or filling layer are not substantially modified by the drying. This feature is in general proof of the absence of strong bonds between the particles, which is a determining factor for obtaining the desired effect of removal with water. It is in general obtained by a rapid drying at a temperature which is not too high relative to the glass transition temperature of the polymer.

The mean diameter of the colloidal polymeric particles in the colloidal aqueous dispersion and/or in the second dried masking and/or filling layer is preferably between 40 and 500 nm, in particular between 50 and 300 nm, and even between 80 and 250 nm.

The polymer is preferably an acrylic polymer or copolymer, for example a styrene/acrylic copolymer. This type of polymer has the advantage of adhering very weakly to the surface of the glass, which allows an easy removal of the layer.

Moreover, the acrylic dispersions are easily obtained by emulsion polymerization reactions that give particles of controlled and reproducible size. Other types of polymers can be used, for example polyurethanes.

The polymer used in the dispersion is preferably completely polymerized, in order to prevent any polymerization reaction between the various particles during drying and/or subsequently. Specifically, these chemical reactions would undesirably increase the cohesion of the second masking and/or filling layer and would prevent the removal using pure water.

The glass transition temperature of the or each polymer of the second masking and/or filling layer is preferably less than or equal to 30° C. Indeed, it has been observed that the glass transition temperature had an influence on the water resistance of the layers obtained. When the glass transition temperature of the polymer is less than around 20° C., the second masking and/or filling layer is easier to remove with cold water. For higher glass transition temperatures (which therefore require drying at a higher temperature), the layer obtained is more resistant to cold water, but can be removed using warm water.

It is possible to deposit the colloidal aqueous dispersion via various techniques, such as flow coating, dip coating, curtain coating or spray coating.

For better resolution, the solid mask zone and/or the cover zone is preferably produced after the grid zone. In particular, it is possible to deposit the first masking layer in order to substantially cover the entire main face and then to produce the cover zone.

The cover is thus deposited on the network mask.

The cover is an added solid element, typically flat, for example metallic or plastic film. It may be, for example, a mask made of nickel or any other magnetic material (which can therefore be held on by virtue of magnets on the face opposite the face of the network mask), or else made of stainless steel or made of copper. The cover may optionally be pierced.

Similarly, it is preferred to form the network mask before forming the solid mask zone.

Furthermore, the network mask zone may be of any shape, straight or curved, for example of geometric shape (rectangular, square, round).

The filled zone and/or the second mask zone and/or the cover zone may itself also be of any straight or curved shape, for example of geometric shape (rectangular, square, etc.).

Furthermore, due to the nature of the first masking layer, it is possible, in addition, to selectively remove a portion of the network mask without damaging it or damaging the subjacent surface, in particular by the mild and simple means which are optical and/or mechanical means.

The material of the network mask has a mechanical strength that is low enough for it to be removed without damaging the substrate, but remains strong enough to withstand the deposition of the electroconductive material for the grid.

Such a removal of the network mask, preferably which is automated, may be carried out:

- by mechanical action, in particular by blowing (focused airflow, etc.), by rubbing with a non-abrasive element (of the felt, fabric, eraser type), by cutting with a cutting element (a blade, etc.);
- and/or by sublimation, by ablation, by a laser-type means.

It is possible to choose the type of removal as a function of the desired resolution, and of the effect on the edges of the mask remaining in contact with the removal means.

In one embodiment, it is possible to carry out a liquid deposition of the first solution over the entire face of the substrate, which is simpler to do, and to partially remove the network mask in particular:

- at least along one edge of the network mask (preferably close to the edge of the substrate) in order to create at least one solid strip (for the connection system and/or for other electrical functions);
- along two edges of the network mask in order to form two solid strips opposite one another or on two adjacent edges; and
- to provide a (complete) outline of the network mask in order to create a solid strip over the entire perimeter (rectangular frame, ring, etc.).

Via partial removal, one or more zones are thus prepared that are ready to receive an electroconductive deposition as a solid layer.

It is thus possible to form, in one go, the grid and one or more connection system elements and/or elements of other electrical functionality.

In the present invention, the expression "connection system zone" is understood to mean in addition a current feed zone when the grid is used as an electrode or as a heating grid.

It is thus possible to connect (by welding, bonding, by pressure) the power supply wires or any other connection element, into the connection system zone or zones. This solution is preferable to the direct connection of the wires to the grid as proposed in the prior art document U.S. Pat. No. 7,172,822 for which the electrical connection is not weak (risk of poor electrical contact).

The formation of contiguous conductive solid zone(s) thus limits risks of poor electrical contact without increasing the cost or the manufacturing time of the targeted device.

Naturally, it is possible, in addition, to choose the design of the "connection system" to order, by delimiting the deposition zone or zones for the grid and the zone or zones for the solid conductor (electrical power supply) and the solid masking zone or zones.

The process may also comprise the formation of a zone free of masking on said face by partial mechanical and/or optical removal of at least one solid (by liquid deposition) or filled mask zone. The deposition of the second masking layer or of the filling layer may separate the network mask zone and the zone free of masking.

It is possible to make provision to form a mark (alignment mark for example), a decorative element, an identification element, a logo or a trademark by suitable partial removal and/or by suitable solid masking (filled layer, cover, etc.).

The surface for the deposition of the masking layer is film-forming in particular preferably hydrophilic if the solvent is aqueous.

The term "hydrophilic" is understood to mean a surface on which the contact angle of a drop of water having a diameter of 1 mm is less than 15°, or even less than 10°.

This is the surface of the substrate, which is preferably transparent: glass, plastic (polycarbonate for example) or quartz, or of an optionally functional added sublayer: hydrophilic layer (layer of silica, for example on plastic) and/or barrier layer to alkali metals and/or adhesion-promoting layer of the grid material, and/or (transparent) electroconductive layer, and/or colored or opaque decorative layer and/or where appropriate etch-stop layer.

The process for manufacturing the electrode described in document U.S. Pat. No. 7,172,822 inevitably requires the deposition of a (chemically or physically) modifiable sublayer at the cracks in order either to allow a favored adhesion (of metal colloids for example) as already indicated, or to allow catalyst grafting for metal postgrowth, this sublayer therefore having a functional role in the growth process of the network.

The sublayer according to the invention is not necessarily a growth layer for an electrolytic deposition of the grid material.

Between the masking layer and the substrate there may be several sublayers.

The substrate according to the invention may thus comprise a sublayer which is a base layer, therefore the layer closest to the substrate, which is a continuous, alkali-metal barrier layer. Such a base layer protects the grid material from any pollution (pollution which may lead to mechanical defects such as delaminations), in the case of an electroconductive deposition (to form an electrode in particular), and additionally preserves its electrical conductivity.

The base layer is robust, quick and easy to deposit according to various techniques. It can be deposited, for example, by a pyrolysis technique, especially in the gas phase (technique often denoted by the abbreviation CVD for "chemical vapor deposition"). This technique is advantageous for the invention since suitable adjustments of the deposition parameters make it possible to obtain a very dense layer for a reinforced barrier.

The base layer may optionally be doped with aluminum and/or boron to render its deposition under vacuum more stable. The base layer (a single layer or multilayer, optionally doped) may have a thickness between 10 and 150 nm, more preferably still between 15 and 50 nm.

The base layer may preferably be:

- based on silicon oxide, silicon oxycarbide, a layer of general formula SiOC;
- based on silicon nitride, silicon oxynitride, silicon oxycarbonitride, a layer of general formula SiNOC, especially SiN, in particular $Si_3N_4$.

Very particularly, a base layer (predominantly) made of doped or undoped silicon nitride $Si_3N_4$ may be preferred. Silicon nitride is deposited very rapidly and forms an excellent barrier to alkali metals.

As a layer that promotes the adhesion of the metal grid material (silver, gold), especially onto glass, it is possible to choose a layer based on NiCr, Mo or MoCr, Ti, Nb, Al, a single or mixed, doped or undoped metal oxide (ITO, etc.), a layer for example having a thickness less than or equal to 5 nm.

When the substrate is hydrophobic, it is possible to add a hydrophilic layer such as a silica layer.

The chosen glass substrate is generally glazing, such as a flat or curved, single or multiple (double, triple, etc.) glazing, toughened or annealed glazing, colorless or tinted glazing, the thickness of which is in particular between 1 and 19 mm, more particularly between 2 and 10 mm, or even between 3 and 6 mm.

It is possible to clean the network of openings using an atmospheric pressure plasma source.

The invention also proposes a substrate bearing on a main face:
- a mask having submillimetric openings, referred to as a network mask, with substantially straight-edged mask areas, the network mask comprising (preferably essentially composed of) a stack of discernible, preferably polymeric, in particular substantially spherical, nanoparticles for example having a glass transition temperature above 50° C., the mask in one zone known as the network mask zone, the network mask preferably being on a hydrophilic surface;
- at least one solid masking zone, adjacent to the network mask zone;
- and/or at least one filled network mask zone;
- and/or at least one cover zone, with a cover over a network mask zone.

The thickness of the masking layer or layers (where appropriate after drying) is preferably between 2 and 100 microns, in particular between 5 and 50 microns, or even between 10 and 30 microns.

The solid masking zone and/or the filled zone and/or the cover may for example separate the network mask zone into at least two regions. The solid masking zone and/or the filled zone and/or the cover may separate the network mask zone with a zone free of masking.

The main face may, in addition, bear at least one second zone free of masking, adjacent to and in contact with the network mask zone. In the case of a heating grid, the solid masking zone is placed so as to adapt the heating power (adjust the distribution of the current).

Owing to this manufacturing process according to the invention, it is possible to obtain, at a lower cost, a mask composed of random (shape and/or size), aperiodic patterns of suitable characteristic dimensions:
- (mean) width of the openings of the network A is micron-sized, or even nanoscale, in particular between a few hundreds of nanometers to a few tens of microns, especially between 200 nm and 50 µm;
- (mean) size of pattern B (therefore size between adjacent openings) is millimetric or even submillimetric, especially between 5 to 800 µm, or even 100 to 250 µm;
- B/A ratio is adjustable, in particular, as a function of the nature of the particles, especially between 7 and 20 or even 40;
- difference between the maximum width of the openings and the minimum width of the openings is less than 4, or even less than or equal to 2, in a given region of the mask, or even over the majority or the whole of the surface;
- difference between the maximum pattern dimension and the minimum pattern dimension is less than 4, or even less than or equal to 2, in a given region of the mask, or even over the majority or even over the whole of the surface;
- the degree of open pattern (non-through or "blind" opening), in other words the degree of rupture of interconnections, is less than 5%, or even less than or equal to 2%, in a given region of the mask, or even over the majority or the whole of the surface, therefore with limited or even almost zero network rupture, which is optionally reduced and can be eliminated by etching of the network;
- for a given pattern, the majority or even all of the patterns in a given region or over the whole of the surface, the difference between the largest dimension that is characteristic of the pattern and the smallest dimension that is characteristic of the pattern is less than 2, in order to strengthen the isotropy; and
- for the majority or even all of the segments of the network, the edges are constantly spaced, parallel, in particular on a scale of 10 µm (for example, observed with an optical microscope with a magnification of 200).

The width A may be, for example, between 1 and 20 µm, or even between 1 and 10 µm, and B may be between 50 and 200 µm.

This makes it possible to subsequently produce a grid defined by a mean strand width A' that is substantially identical to the width of the openings A and a (mean) space between the strands B' that is substantially identical to the space between the openings B (the dimension of a mesh).

In particular, the sizes of the strands A' may preferably be between a few tens of microns to a few hundreds of nanometers. The B'/A' ratio may be chosen between 7 and 20, or even 30 to 40.

The patterns delimited by the openings (and in the meshes of the grids obtained) are of diverse shapes, typically with three, four or five sides, for example predominantly with four sides, and/or of diverse sizes, distributed randomly and aperiodically.

For the majority or even all of the patterns (respectively the meshes), the angle between two adjacent sides of a pattern may be between 60° and 110°, especially between 80° and 100°.

In one configuration, there is obtained a main network with openings (optionally approximately parallel) and a secondary network of openings (optionally approximately perpendicular to the parallel network), the location and the distance of which are random. The secondary openings have a width, for example, smaller than the main openings.

It is possible to modify other control parameters chosen from the friction coefficient between the compacted colloids, in particular by nanotexturing of the substrate and the surface of the substrate, the size of the nanoparticles and the initial nanoparticle concentration, the nature of the solvent and the thickness that is dependent on the deposition technique, in order to adjust B, A and/or the B/A ratio.

The thickness of the network mask may submicron-sized up to several tens of microns. The greater the thickness of the masking layer is, the larger A (respectively B) is.

The higher the concentration is (all things otherwise being equal), the lower B/A is.

The edges of the network mask openings are substantially straight, that is to say along a mid-plane between 80° and 100° relative to the surface, or even between 85° and 95°.

Moreover, the characteristic dimensions of the grids made by photolithography, generally of regular and periodic shape (square, rectangular), form networks of 20 to 30 µm wide metal strands spaced, for example, 300 µm apart, which are the source, when they are illuminated by a point light source, of diffraction patterns. And it would be even more difficult and expensive to make grids with random patterns. Each pattern to be produced would require a specific mask.

This manufacturing technique of the prior art furthermore has a resolution limit of around a few tens of µm, leaving the patterns esthetically visible.

The network mask according to the invention therefore makes it possible to envision at lower cost, irregular grids of other shapes, of any size.

According to the invention, the dimensions of the strands may be very small, (a few µm) and the thicknesses of the strands very small (for example 500 nm). Therefore, the grids have a low electrical resistance (<2 ohm) and a high light transmission (>80%) and are almost invisible.

The mask makes it possible to manufacture an irregular grid with a real meshing or paving, random grid in at least one (grid) direction, and not a simple network conductor as proposed in document U.S. Pat. No. 7,172,822.

The invention therefore also relates to the manufacture of a submillimetric electroconductive grid and of a (so-called) functional zone on a main face of a substrate successively comprising:
- after the drying of the first masking layer and the formation of the solid masking zone (where appropriate dry) and/or of the filled mask zone (where appropriate dry), and/or the placement of the cover, the deposition of an electroconductive material;
- (directly or indirectly) on the face, through the openings of the already defined network mask, until a fraction of the depth of the openings is filled;

and comprising
- the removal of the first masking layer revealing the submillimetric electroconductive grid;
- the removal of the second masking layer and/or of the filling layer and/or of the cover, leaving the functional zone bare.

This electroconductive grid may form one or more (semi) transparent electrodes of an electrically controllable system and/or a heating grid.

Naturally, the electroconductive deposition may also be deposited on the solid mask zone and/or the filled mask zone and/or the cover.

The arrangement of the strands (in other words the network of strands, the strands delimiting meshes) may then be substantially the replica of that of the network of openings.

Owing to the straight edges of the openings of the network mask (that result in no or little deposition along the edges of the openings) it is thus possible to remove the coated mask without damaging the grid.

For the sake of simplicity, directional grid material deposition techniques may be favored. The deposition may be carried out both through the openings and over the mask.

Preferably, the removal of the first masking layer is carried out via a liquid route, by a solvent that is inert for the grid, preferably water, or else acetone, alcohol, NMP (N-methylpyrrolidone), the solvent optionally being hot and/or assisted by ultrasound.

The removal of the second masking layer and/or of the filling layer may take place before, after or at the same time as the removal of the first masking layer.

Preferably, the removals of the first masking layer, of the second masking layer and/or of the filling layer are carried out in one step, via a liquid route, in particular by one and the same, preferably aqueous, solvent.

For the removal, the water is preferably pure, in the sense that it does not comprise organic compounds (for example detergents), or inorganic compounds (for example ammonium salts) apart from traces that are difficult to avoid. The pH of the water used is preferably between 6 and 8, in particular between 6.5 and 7.5. The pH may sometimes be below 6, especially in the case of deionized water.

The process may furthermore comprise the deposition of said conductive material in a zone free of masking adjacent to and in contact with a network mask zone or adjacent to a solid masking zone or to a filled mask zone.

The process may comprise the deposition of insulating material in the bare functional zone, for example silica or silicon nitride (especially by magnetron sputtering or plasma CVD).

The deposition of the electroconductive material may be an atmospheric pressure deposition, in particular via plasma, a deposition under vacuum, by sputtering or by evaporation.

It is thus possible to then choose one or more deposition techniques that can be carried out at ambient temperature and/or that are simple (in particular simpler than a catalytic deposition that inevitably requires a catalyst) and/or that give dense deposits.

It is possible to deposit an electrically conductive material onto the electroconductive material via electrolysis.

The deposition may thus be optionally completed by an electrolytic recharge using an electrode made of Ag, Cu, Au or another usable metal with high conductivity.

When the substrate is insulating, the electrolytic deposition may be carried out either before or after removal of the mask.

By varying the B'/A' ratio (space between the strands B' over the width of the strands A'), haze values between 1 and 20% are obtained for the grid.

The invention also relates to a substrate, preferably which is transparent, bearing on a main face a submillimetric irregular electroconductive grid, that is to say a two-dimensional meshed network of strands with (closed), in particular random, meshes in at least one direction of the grid (therefore parallel to the substrate) and a functional zone adjacent to, preferably in contact with, the grid.

This grid and the functional zone may especially be formed from the substrate bearing the masks that have already been defined previously or from the manufacturing process that has already been defined previously.

The face may also bear a solid electroconductive zone adjacent to, preferably in contact with, an electroconductive material, for example said electroconductive material.

This solid electroconductive zone may be a wide, especially rectangular, strip.

The grid may have one or more of the following characteristics:
- a ratio of the (mean) space between the strands (B') to the submillimetric (mean) width of the strands (A') of between 7 and 40;
- the meshes of the grid are random (aperiodic) and of diverse shape and/or size;
- the meshes delimited by the strands have three and/or four and/or five sides, for example mostly four sides;
- the grid has an aperiodic (or random) structure in at least one grid direction, preferably in two directions;
- for most, or even all, of the meshes in a given region or over the entire surface, the difference between the largest characteristic dimension of the mesh and the smallest characteristic dimension of the mesh is less than 2;
- for most, or even all, of the meshes, the angle between two adjacent sides of one mesh may be between 60° and 110°, especially between 80° and 100°;
- the difference between the maximum width of the strands and the minimum width of the strands is less than 4, or even less than or equal to 2, in a given grid region, or even over the majority or all of the surface;
- the difference between the maximum mesh dimension (space between strands forming a mesh) and the minimum mesh dimension is less than 4, or even less than or equal to 2, in a given grid region, or even over the majority or all of the surface;

the amount of non-sealed mesh and/or of cut ("blind") strand segment is less than 5%, or even less than or equal to 2%, in a given grid region, or even over the majority or all of the surface, i.e. a limited or even almost zero network rupture;

for the most part, the strand edges are constantly spaced, in particular substantially linear, parallel, on a scale of 10 µm (for example observed with an optical microscope with a magnification of 200).

The grid according to the invention may have isotropic electrical properties.

Unlike the network conductor of the prior art with a favored direction, the irregular grid according to the invention may not diffract a point light source.

The thickness of the strands may be substantially constant in thickness or be wider at the base.

The grid according to the invention may comprise a main network with strands (that are optionally approximately parallel) and a secondary network of strands (that are optionally approximately perpendicular to the parallel network).

The grid according to the invention may be deposited over at least one surface portion of the substrate, especially a substrate having a glass function, made of a plastic or an inorganic material, as already indicated.

The grid according to the invention may be deposited onto a sublayer that is a hydrophilic layer and/or a layer that promotes adhesion and/or a barrier layer and/or a decorative layer as already indicated.

The electroconductive grid according to the invention may have a sheet resistance between 0.1 and 30 ohm/square. Advantageously, the electroconductive grid according to the invention may have a sheet resistance less than or equal to 5 ohm/square, or even less than or equal to 1 ohm/square, or even 0.5 ohm/square, especially for a grid thickness greater than or equal to 1 µm, and preferably less than 10 µm or even less than or equal to 5 µm.

The substrate may be flat or curved (for example a tube for a coaxial lamp), and additionally rigid, flexible or semi-flexible.

The main faces of the flat substrate may be rectangular, square or even of any other shape (round, oval, polygonal, etc.).

The substrate may be of a large size, for example having a surface area greater than $0.02$ m$^2$, or even $0.5$ m$^2$ or 1 m$^2$.

The substrate may be substantially transparent, inorganic or made of a plastic such as polycarbonate PC or polymethyl methacrylate PMMA, or else PET, polyvinyl butyral PVB, polyurethane PU, polytetrafluoroethylene PTFE, etc.

The substrate is preferably glass, especially made of soda-lime-silica glass.

The substrate may have a glass function when it is substantially transparent, and when it is based on inorganic materials (for example, a soda-lime-silica glass) or when it is based on a plastic (such as polycarbonate PC or on polymethyl methacrylate PMMA or else PET).

In order to transmit UV radiation, the substrate may preferably be chosen from quartz, silica, magnesium fluoride (MgF$_2$), calcium fluoride (CaF$_2$), a borosilicate glass or a glass with less than 0.05% of Fe$_2$O$_3$.

To give examples, for thicknesses of 3 mm:

magnesium or calcium fluorides transmit more than 80%, or even 90%, over the entire range of UV bands, that is to say UVA (between 315 and 380 nm), UVB (between 280 and 315 nm), UVC (between 200 and 280 nm) and VUV (between about 10 and 200 nm);

quartz and certain high-purity silicas transmit more than 80%, or even 90%, over the entire range of UVA, UVB and UVC bands;

borosilicate glass, such as Borofloat from Schott, transmits more than 70% over the entire UVA band; and soda-lime-silica glass with less than 0.05% Fe(III) or Fe$_2$O$_3$, especially the glass Diamant from Saint-Gobain, the glass Optiwhite from Pilkington, and the glass B270 from Schott, transmit more than 70% or even 80% over the entire UVA band.

However, a soda-lime-silica glass, such as the glass Planilux sold by Saint-Gobain, has a transmission of more than 80% above 360 nm, which may be sufficient for certain constructions and certain applications.

The (overall) light transmission of the substrate coated with the grid may be greater than or equal to 50%, more preferably still greater than or equal to 70%, especially is between 70% and 86%.

The (overall) transmission, in a given UV band, of the substrate coated with the grid may be greater than or equal to 50%, more preferably still greater than or equal to 70%, especially is between 70% and 86%.

The B'/A' ratio may be different, for example at least double, in a first grid region and in a second grid region.

The first and second regions may be of different or equal shape and/or of different or equal size.

The light transmission of the network depends on the B'/A' ratio of the mean distance between the strands B' to the mean width of the strands A'.

Preferably, the B'/A' ratio is between 5 and 15, more preferably still around 10, to easily retain the transparency and facilitate the manufacture. For example, B' and A' are respectively equal to around 50 µm and 5 µm.

In particular, a mean strand width A' is chosen between 100 nm and 30 µm, preferably less than or equal to 10 µm, or even 5 µm in order to limit their visibility and greater than or equal to 1 µm to facilitate the manufacture and to easily retain a high conductivity and a transparency.

In particular, it is additionally possible to choose a mean distance between strands B' that is greater than A', between 5 µm and 300 µm, or even between 20 and 100 µm, to easily retain the transparency.

The thickness of the strands may be between 100 nm and 5 µm, especially micron-sized, more preferably still from 0.5 to 3 µm to easily retain a transparency and a high conductivity.

The grid according to the invention may be over a large surface area, for example a surface area greater than or equal to 0.02 m$^2$, or even greater than or equal to 0.5 m$^2$ or to 1 m$^2$.

The grid may form an electrode that is divided into several zones, a plurality of coplanar electrodes at different potentials, or a heating grid and the functional zone may be a separating zone for the grid zones (heating zones or electrode(s) zones).

The grid may also form a heating grid, the functional zone or zones (lines, etc.) being used to adapt the heating power.

The substrate may comprise a solid electroconductive zone adjacent to the grid, the grid may form a lower electrode (the closest to the substrate) and the functional zone may act as a separator zone for the solid electroconductive zone such as a connection zone for an upper electrode.

The grid according to the invention may be used, in particular, as a lower electrode (the closest to the substrate) for an organic light-emitting device (OLED) especially a bottom emission OLED or a bottom and top emission OLED.

The grid may form an antenna coating of an antenna glazing for a vehicle (windshield, rear window, porthole, etc.) or a heating grid of a glazing for a building or for a vehicle (windshield, rear window, porthole, etc.). The substrate may be too opaque to information-bearing radiation (glass or plastic substrate for example) and the functional zone may form a communication window (electronic toll collection system, etc.).

Indeed, current technology makes it possible to use the transmission of signals and of data, by means of electromagnetic radiation in the non-visible range of the spectrum, for a wide variety of applications, whether this is for vehicles or for buildings.

Thus, for example, infrared emitters and receivers are currently used for remotely controlling alarm or locking systems. In respect of motor vehicles, this technique allows the transmission of information relating to the traffic situation or to the position of a vehicle, dialogue with tax recognition systems or calculation of the distance separating one vehicle from others, whereas for buildings, it allows people approaching to be recorded. For such applications, it is possible to use microwave (for example at 5.6 GHz) or ultraviolet emitters and receivers.

Microwave technology itself makes it possible to perform many other functions, such as for example transmission by wireless telephony within a digital network, digital audio broadcasting, whether it takes place by satellite or not, and also the location of a vehicle by means of a wireless detection system.

Therefore, for the transmission of signals and data, a communication window is provided.

The communication window may be of any shape (square, rectangular, etc.). It may preferably be placed at the periphery, for example along one edge of the glazing, preferably an edge without a connection system.

The grid may be a layer having an electrical function (electrode, heating grid), and the functional zone surrounds the grid (forms an outline), in particular a peripheral frame of the substrate.

This makes it possible, for example, to prevent grounding (contact with bodywork in particular) and/or to protect the grid from corrosion.

A multiple laminated glazing (lamination interlayer of EVA, PU, PVB, etc. type) may incorporate a substrate bearing the grid according to the invention with the functional zone.

The invention also relates to the incorporation of a grid such as obtained from the production of the mask described previously in glazing, operating in transmission.

The term "glazing" should be understood in the broad sense and encompasses any essentially transparent material, having a glass function, that is made of glass and/or of a polymer material (such as polycarbonate PC or polymethyl methacrylate PMMA). The carrier substrates and/or counter-substrates, that is to say the substrates flanking the active system, may be rigid, flexible or semi-flexible.

The invention also relates to the various applications that may be found for these devices, glazing or mirrors: they may be used for producing architectural glazing, especially exterior glazing, internal partitions or glazed doors. They may also be used for windows, roofs or internal partitions of modes of transport such as trains, planes, cars, boats and worksite vehicles.

They may also be used for display screens such as projection screens, television or computer screens, touch-sensitive screens, illuminating surfaces and heated glazing.

Thus, it targets the use of a submillimetric irregular grid with the functional zone as described previously as:
electrodes (single-layer or multilayer electrodes) in an electrochemical and/or electrically controllable device having variable optical and/or energy properties, for example a liquid crystal device or a photovoltaic device, or else an organic or inorganic light-emitting device (TFEL, etc.), a lamp especially a flat lamp, an optionally flat UV lamp;

heating grid of a heating device, for example for a vehicle (windshield, rear window, porthole), for electrical goods of the radiator, towel warmer or refrigerated cabinet type, for a defrosting, anti-condensation, anti-fogging, etc. action.

The electroconductive grid, in several zones, forms one or more electrodes, the functional zone being used to separate said zones.

As a reminder, in electrochromic systems, there are "all solid" electrochromic systems (the term "all solid" being defined, within the context of the invention, in respect of the multilayer stacks for which all the layers are of inorganic nature) or "all polymer" electrochromic systems (the term "all polymer" being defined, within the context of the invention, in respect of the multilayer stacks for which all the layers are of organic nature), or else mixed or hybrid electrochromic systems (in which the layers of the stack are of organic nature and inorganic nature) or else liquid-crystal or viologen systems.

As a reminder, discharge lamps comprise phosphor(s) as active element. Flat lamps in particular comprise two glass substrates held slightly apart, generally separated by less than a few millimeters, and hermetically sealed so as to contain a gas under reduced pressure, in which an electrical discharge produces radiation generally in the ultraviolet range, which excites a phosphor, which then emits visible light.

Flat UV lamps may have the same structure, naturally for at least one of the walls a material is chosen that transmits UV (as already described). The UV radiation is directly produced by the plasma gas and/or by a suitable additional phosphor.

As examples of flat UV lamps, reference may be made to patents WO 2006/090086, WO 2007/042689, WO 2007/023237 and WO 2008/023124 which are incorporated by reference.

The discharge between the electrodes (anode and cathode) may be non-coplanar ("plane-plane"), with anode and cathode respectively associated with the substrates, via a face or in the thickness, (both internal or external, one internal and the other external, at least one in the substrate, etc.), for example as described in patents WO 2004/015739, WO 2006/090086 or WO 2008/023124 which are incorporated by reference.

In UV lamps and flat lamps, the discharge between the electrodes (anode and cathode) may be coplanar (anode and cathode in one and the same plane, on one and the same substrate) as described in patent WO 2007/023237 which is incorporated by reference. When the electrodes are coplanar, the insulating zone or zones may therefore be used to separate the (groups of) electrodes at different potentials.

It may be another type of lighting system, namely an inorganic light-emitting device, the active element being an inorganic light-emitting layer based on a doped phosphor, for example chosen from: ZnS:Cu, Cl; ZnS:Cu,Al; ZnS:Cu,Cl,Mn or else CaS or SrS. This layer is preferably separated from the electrodes by insulating layers. Examples of such glazing are described in document EP 1 553 153 A (with the materials, for example, in table 6).

Liquid crystal glazing may be used as variable light scattering glazing. It is based on the use of a film based on a polymer material and placed between two conductive layers, droplets of liquid crystals, especially nematic liquid crystals having positive dielectric anisotropy, being dispersed in said material. When a voltage is applied to the film, the liquid crystals orient in a preferred direction, thereby allowing vision. With no voltage applied, the crystals not being aligned, the film becomes diffusing and prevents vision. Examples of such films are described, in particular, in European Patent EP 0 238 164 and U.S. Pat. No. 4,435,047, U.S. Pat. No. 4,806,922 and U.S. Pat. No. 4,732,456. This type of film, once laminated and incorporated between two glass substrates, is sold by SAINT-GOBAIN GLASS under the brand name Privalite.

In fact, it is possible to use any device based on liquid crystals known under the terms "NCAP" (nematic curvilinearly aligned phases) or "PDLC" (polymer dispersed liquid crystal) or "CLC" (cholesteric liquid crystal).

The latter may also contain dichroic dyes, in particular in solution in the droplets of liquid crystals. It is then possible to jointly modulate the light scattering and the light absorption of the systems.

It is also possible to use, for example, gels based on cholesteric liquid crystals containing a small amount of crosslinked polymer, such as those described in patent WO 92/19695.

Therefore, the invention finally relates to the use of the substrate bearing the irregular submillimetric electroconductive grid and a functional zone, the electroconductive grid in several zones forming one or more electrodes, the functional zone being used to separate said zones, in an electrochemical and/or electrically controllable device having variable optical and/or energy properties, in particular a liquid crystal device, or a photovoltaic device, or else a light-emitting device, in particular an organic, or inorganic, light-emitting device, a discharge lamp, in particular a flat discharge lamp, a UV discharge lamp, in particular a flat UV discharge lamp.

Therefore, the invention finally relates to the use of the substrate bearing the irregular submillimetric electroconductive grid with a functional zone and with a solid electroconductive zone, the electroconductive grid being an electrode known as a lower electrode, the functional zone being used to separate the grid from the solid electroconductive zone in order to connect an electrode known as an upper electrode, in an organic light-emitting device or any other device with an electroactive system between a lower electrode and an upper electrode which are connected to a single substrate.

BRIEF DESCRIPTION OF THE DRAWINGS

The invention will now be described in greater detail with the aid of non-limiting examples and figures.

DETAILED DESCRIPTION

Manufacture of the Network Mask

A simple emulsion of colloidal nanoparticles based on an acrylic copolymer that are stabilized in water at a concentration of 40 wt %, a pH of 5.1 and with a viscosity equal to 15 mPa·s is deposited by a wet route technique, by spin coating, onto a main face of a substrate 2 having a glass function, for example which is flat and inorganic. The colloidal nanoparticles have a characteristic dimension between 80 and 100 nm and are sold by DSM under the trademark Neocryl XK 52® and have a $T_g$ equal to 115° C.

Drying of the layer incorporating the colloidal particles is then carried out so as to evaporate the solvent and form the openings. This drying may be carried out by any suitable process and at a temperature below the $T_g$ (hot air drying, etc.), for example at ambient temperature.

Figure 1:
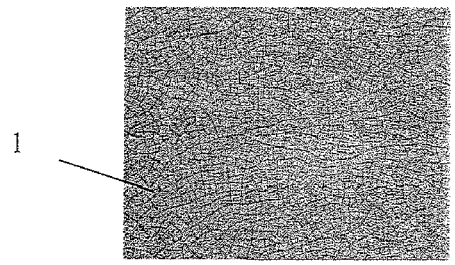
FIGS. 1 to 2d represent network masks obtained by the process according to the invention.
Figure 2:
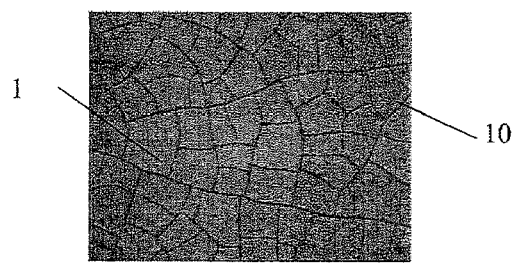

During this drying step, the system rearranges itself and forms a network mask 1 comprising a network of openings 10. It depicts patterns, exemplary embodiments of which are represented in FIGS. 1 and 2 (400 μm×500 μm views).

A stable network mask 1 is obtained without resorting to annealing, having a structure characterized by the (mean) width of the opening subsequently referred to as A and the (mean) space between the openings subsequently referred to as B. This stabilized network mask will subsequently be defined by the ratio B/A.

More specifically, it is a two-dimensional network of openings, which is "meshed" with little rupture of the "meshes" or rupture of interconnections (few blocked opening or blind opening segments).

Figure 2A:
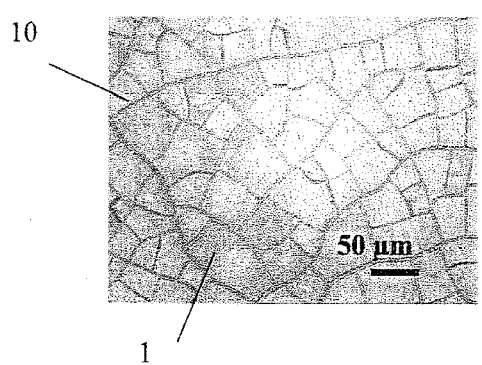
Figure 2B:
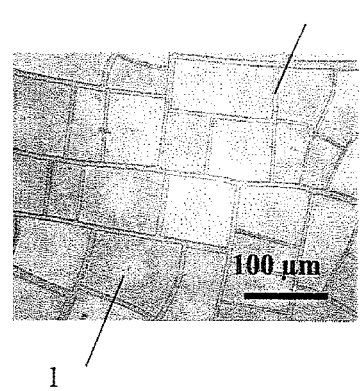

The influence of the drying temperature was evaluated. Drying at 10° C. under 20% RH results in an 80 μm mesh (cf. FIG. 2a), whereas drying at 30° C. under 20% RH results in a 130 μm mesh (cf. FIG. 2b).

The influence of the drying conditions, especially the degree of humidity, was evaluated. The layer based on XK52 is this time deposited by flow coating which gives a variation in thickness between the bottom and the top of the sample (from 10 μm to 20 μm) resulting in a variation of the mesh size. The higher the humidity is, the smaller B is.

| Drying | Position | Mesh size B (μm) |
|---|---|---|
| 10° C. - 20% humidity | top | 65 |
| 10° C. - 20% humidity | bottom | 80 |
| 10° C. - 80% humidity | top | 45 |
| 10° C. - 80% humidity | bottom | 30 |

-continued

| Drying | Position | Mesh size B (μm) |
|---|---|---|
| 30° C. - 20% humidity | top | 60 |
| 30° C. - 20% humidity | bottom | 130 |
| 30° C. - 80% humidity | top | 20 |
| 30° C. - 80% humidity | bottom | 45 |

This B/A ratio is also modified by adjusting, for example, the friction coefficient between the compacted colloids and the surface of the substrate, or else the size of the nanoparticles, or even also the evaporation rate, or the initial particle concentration, or the nature of the solvent, or the thickness that is dependent on the deposition technique, etc.

In order to illustrate these various possibilities, an experimental design is given below with 2 concentrations of the colloid solution ($C_0$ and $0.5 \times C_0$) and various thicknesses deposited by adjusting the ascent rate of the dip coater. It is observed that it is possible to change the B/A ratio by changing the concentration and/or the drying rate. The results are given in the following table:

| Weight concentration | Ascent rate of the dip coater (cm/min) | B: space between the openings (μm) | A: width of the openings (μm) | B/A ratio |
|---|---|---|---|---|
| 20% | 5 | 25 | 3 | 8.4 |
| 20% | 10 | 7 | 1 | 7 |
| 20% | 30 | 8 | 1 | 8 |
| 20% | 60 | 13 | 1.5 | 8.6 |
| 40% | 5 | 50 | 4 | 12.5 |
| 40% | 10 | 40 | 3.5 | 11.4 |
| 40% | 30 | 22 | 2 | 11 |
| 40% | 60 | 25 | 2.2 | 11.4 |

The colloid solution was deposited at the concentration of $C_0$=40% by using film-drawers of various thicknesses. These experiments show that the size of the strands and the distance between the openings can be varied by adjusting the initial thickness of the colloid layer.

| Thickness deposited by the film-drawer (μm) | Weight % | B: space between the openings (μm) | A: width of the openings (μm) | B/A ratio |
|---|---|---|---|---|
| 30 | 40 | 20 | 2 | 10 |
| 60 | 40 | 55 | 5 | 11 |
| 90 | 40 | 80 | 7 | 11.4 |
| 120 | 40 | 110 | 10 | 11.1 |
| 180 | 40 | 200 | 18 | 11.1 |
| 250 | 40 | 350 | 30 | 11.6 |

Finally, the surface roughness of the substrate was modified by etching, with atmospheric plasma, the surface of the glass via a mask of Ag nodules. This roughness is of the order of magnitude of the size of the contact zones with the colloids which increases the friction coefficient of these colloids with the substrate. The following table shows the effect of changing the friction coefficient on the B/A ratio and the morphology of the mask. It appears that smaller mesh sizes at an identical initial thickness and a B/A ratio which increases are obtained.

| Nanotexturing treatment | Ascent rate of the dip coater (cm/min) | B: space between the openings (μm) | A: width of the openings (μm) | B/A ratio |
|---|---|---|---|---|
| Yes | 5 | 38 | 2 | 19 |
| Yes | 10 | 30 | 1.75 | 17.2 |
| Yes | 30 | 17 | 1 | 17 |
| Yes | 60 | 19 | 1 | 17.4 |
| Reference | 5 | 50 | 4 | 12.5 |
| Reference | 10 | 40 | 3.5 | 11.4 |
| Reference | 30 | 22 | 2 | 11 |
| Reference | 60 | 25 | 2.2 | 11.4 |

In another exemplary embodiment, the dimensional parameters of the network of openings obtained by spin coating of one and the same emulsion containing the colloidal particles described previously are given below. The various rotational speeds of the spin-coating device modify the structure of the mask.

| Rotational speed (rpm) | B: space between the openings (μm) | A: width of the openings (μm) | B/A ratio |
|---|---|---|---|
| 200 | 40 | 2 | 20 |
| 400 | 30 | 2 | 15 |
| 700 | 20 | 1 | 20 |
| 1000 | 10 | 0.5 | 20 |

Figure 5:
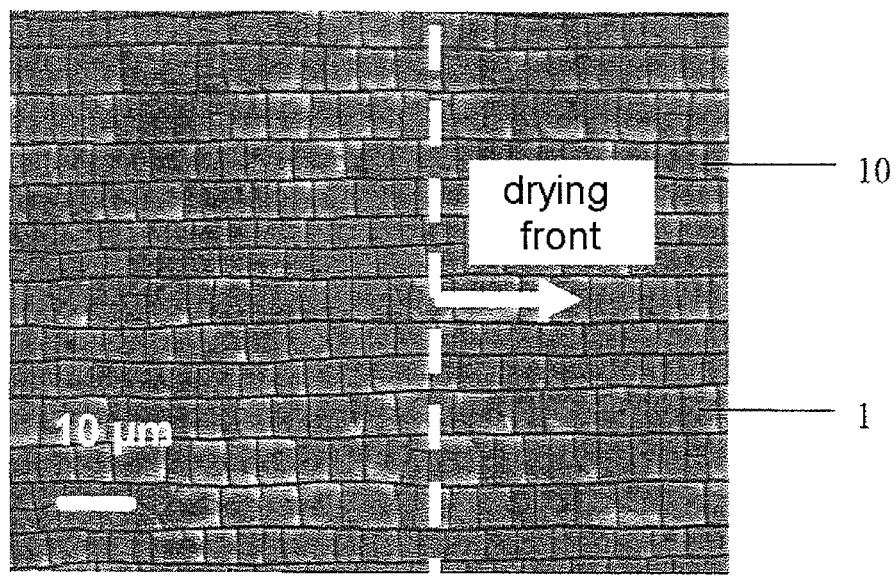
FIGS. 5 and 6 represent network masks with different drying fronts.
Figure 6:
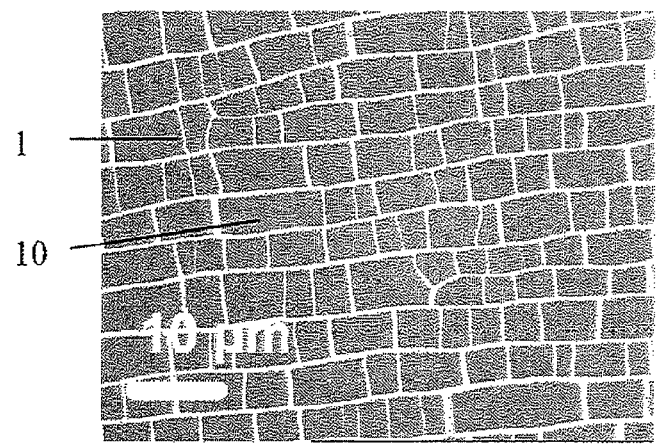

The effect of the propagation (cf. FIGS. 5 and 6) of a drying front on the morphology of the mask was studied. The presence of a drying front makes it possible to create a network of approximately parallel openings, the direction of which is perpendicular to this drying front. There is, on the other hand, a secondary network of openings approximately perpendicular to the parallel network, for which the location and the distance between the strands are random.

At this stage of the implementation of the process, a network mask 1 is obtained.

Figure 3A:
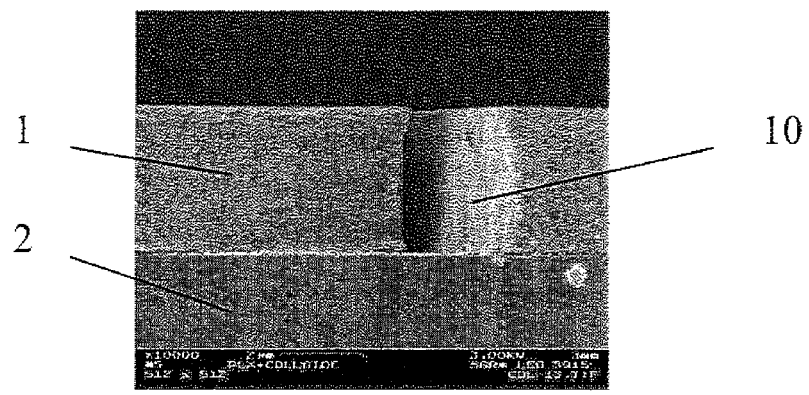
FIG. 3a is an SEM view illustrating the profile of the opening of a network mask according to the invention.

A morphological study of the network mask 1 showed that the openings 10 have a profile with straight mask area edges. Reference can be made to FIG. 3a which is a partial transverse view of the mask 1 obtained using SEM.

The profile is represented in FIG. 3a and has a particular advantage for:
  depositing, especially in a single step, a large thickness of material; and
  retaining a pattern, in particular of large thickness, that conforms to the mask after having removed the latter.

The network mask 1 thus obtained may be used as is or modified by various post-treatments. If there are no colloidal particles at the bottom of the openings, there will therefore be a maximum adhesion of the material that is introduced in order to fill the opening (this will be described in detail later on in the text) with the substrate having a glass function.

The inventors have furthermore discovered that the use of a plasma source as a source for cleaning the organic particles located at the bottom of the opening made it possible, subsequently, to improve the adhesion of the material being used as the grid.

As an exemplary embodiment, cleaning with the aid of an atmospheric-pressure plasma source, with a transferred-arc plasma based on an oxygen/helium mixture, makes it possible both to improve the adhesion of the material deposited at the bottom of the openings and to widen the openings. A plasma source of the brand "ATOMFLOW" sold by Surfx may be used.

Figure 2C:
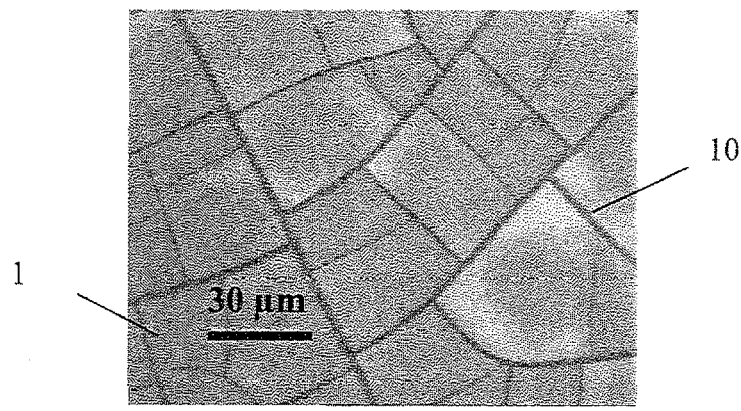
Figure 2D:
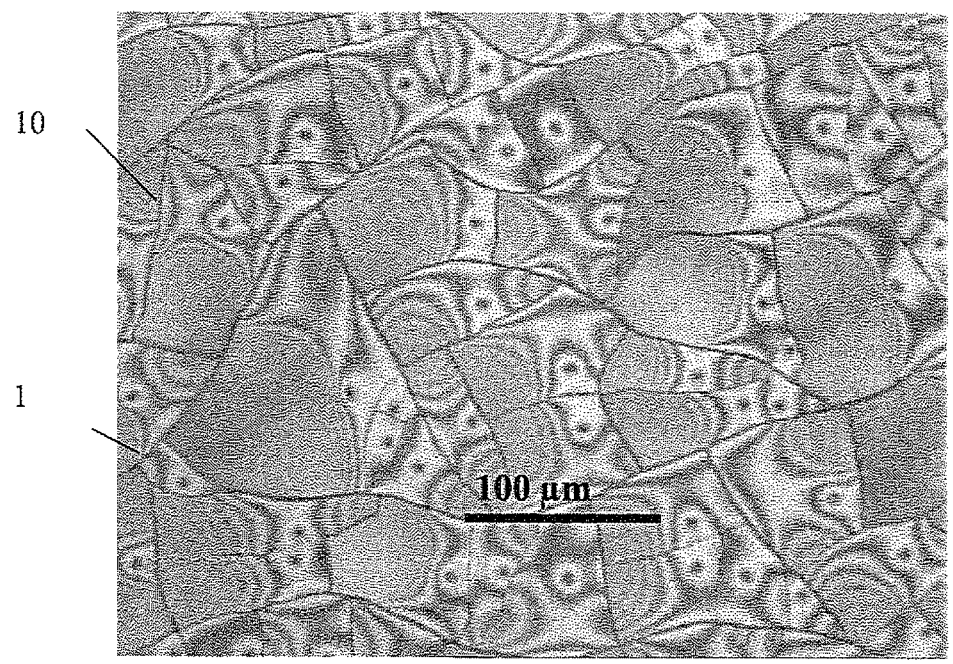

In another embodiment, a simple emulsion of colloidal particles based on an acrylic copolymer, which are stabilized in water at a concentration of 50 wt %, a pH of 3 and a viscosity equal to 200 mPa·s is deposited. The colloidal particles have a characteristic dimension of around 118 nm and are sold by DSM under the trademark Neocryl XK 38° and have a $T_g$ equal to 71° C. The network obtained is shown in FIG. 2c. The space between the openings is between 50 and 100 μm and the range of the widths of the openings is between 3 and 10 μm.

In another embodiment, a 40% solution of silica colloids with a characteristic dimension of around 10 to 20 nm, for example the product LUDOX® AS 40 sold by Sigma Aldrich, is deposited. The B/A ratio is around 30, as shown in FIG. 2e.

Typically, it is possible to deposit, for example, between 15% and 50% of silica colloids in an organic (especially aqueous) solvent.

Once the network mask 1 is obtained, preferably that covers the entire main face of the substrate 2, it may be desired to completely (solidly) mask one or more zones.

Solid Masking or Filling by Dispersion of Nanoparticles

The solid mask may firstly be obtained by filling the network mask. In a first example, in order to fill the interstices of the network mask in certain zone(s), use is made of an aqueous dispersion of nanoparticles of an acrylic copolymer sold under the name NeoCryl XK-240 by DSM NeoResins. This dispersion is composed of 48% by weight of water and 52% by weight of particles of an acrylic copolymer, the mean diameter of which is around 180 nm (measured by known methods, using light scattering). The glass transition temperature of the polymer is −4° C. The viscosity of the dispersion at 25° C. is 160 mPa·s and its pH is 7.5.

The dispersion is deposited on the glass substrate by dip coating, and after drying at ambient temperature without forced ventilation for a few minutes (typically 2 to 3 minutes), the layer obtained is continuous, having a thickness of around 20 microns. The light transmission of the protective layer is around 88%, the haze around 30%.

The layer may nevertheless be very easily removed by spraying with pure water (to which no organic additives have been added) at ambient temperature.

In a second example, in order to fill the interstices of the network mask in certain zone(s), the colloidal dispersion used is an aqueous dispersion of an acrylic copolymer sold under the name NeoCryl XK-87 by DSM NeoResins. This dispersion is composed of 49% by weight of water and 51% by weight of particles of a styrene/acrylic copolymer, the mean diameter of which is around 210 nm. The glass transition temperature of the polymer is 24° C. The viscosity of the dispersion at 25° C. is 250 mPa·s and its pH is 7.4.

This dispersion is applied as in the case of the first example, but the drying here is carried out at 35° C., in order to maintain a temperature above the glass transition temperature of the polymer.

The optical and friction resistance properties are similar to those of the first example. However the layer is resistant to cold water. On the other hand, the layer can easily be removed using warm water (at around 30 to 35° C.) by gently rubbing using a sponge or a cloth.

The solid mask may also be obtained by liquid deposition of a masking material, for example identical to those mentioned above for the filling operation. Thus, one or more solid mask zones are formed adjacent to (optionally in contact with) the network mask zone partially covering the substrate.

Figure 3B:
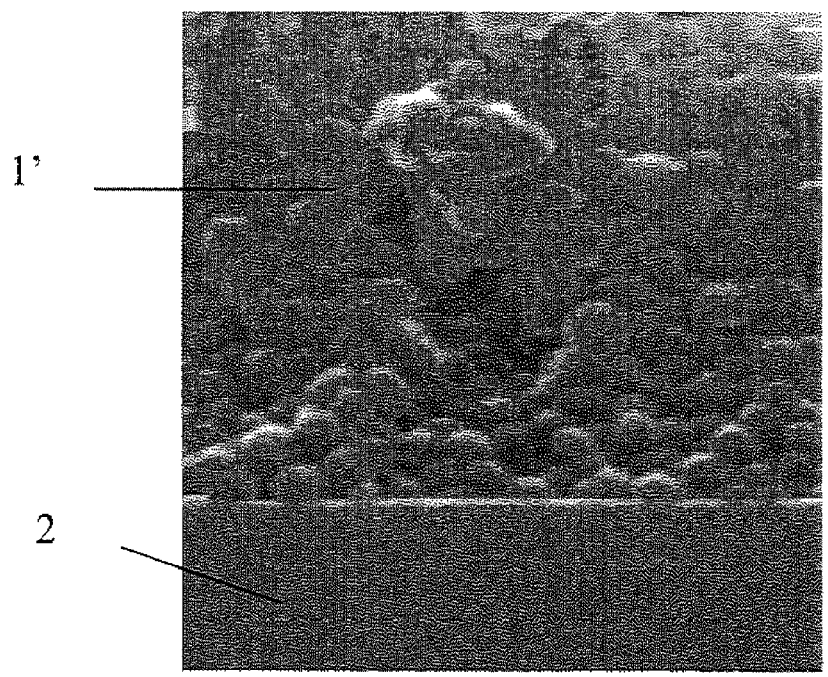
FIG. 3b is an SEM view illustrating a solid mask zone.

FIG. 3b thus represents a view taken by scanning electron microscopy of a cross section of a glass sample covered with a solid masking layer 1' according to the invention obtained from a colloidal solution of the type of those described. Seen in the figure is a portion of the glass substrate 2 covered with a solid masking layer according to the invention, of which only one portion is visible in the figure. The layer 1' is composed of an assembly of a multitude of nanoparticles, which are perfectly discernible.

The network mask may preferably be formed first (on a given portion of the substrate for example) and then the masking material for the adjacent solid mask is deposited.

Alternatively, the solid mask zone or zones are formed first and then the colloidal solution for the network mask is deposited in the remaining zones (and/or as an overlayer in the solid zones).

The solid mask may also be obtained by placing a cover preferably over the network mask. For example, a cover made of nickel, held on by magnets placed on the face opposite the main masking face, is chosen. Thus one or more cover zones are formed.

Finally, it is possible to deposit via a liquid route, for example by screen printing, a paste loaded with micron-sized inorganic particles that are preferably soluble in water onto the network mask, and in the network mask zone or zones to be solidly masked.

Solid Masking or Filling by Water-Soluble Film

A water-soluble film is formed by screen printing. 20 g of PVA powder, for example MOWIOL sold by KUKARAY, mixed with 80 g of cold water are used. The mixture is heated at 90-95° C. while mixing for 30 minutes. It is then cooled with ambient air and applied by screen printing to the network mask (forming filled mask zone), and/or adjacent to the network mask zone (forming an adjacent solid zone).

The film is removed with water, preferably at the same time as the network mask.

Partial Removal

The network mask 1 preferably occupies the entire face of the substrate 2. Once the network mask is obtained and the solid zone or zones are produced (cover zone, solid masking zone, filled zone), one or more predefined zones of the (filled or unfilled) network mask and/or of the solid mask (obtained by a liquid route) are removed, for example by blowing or by laser, in order to create zones free of masking.

This removal may consist, for example, of:
the removal of one or more lateral (or longitudinal) rectangular strips having a width of a few mm;
an outlining, the zone free of masking therefore framing the network mask.

Examples illustrating a network mask with filled zones and with removed zones are presented in FIGS. 3c to 3g.

Figure 3C:
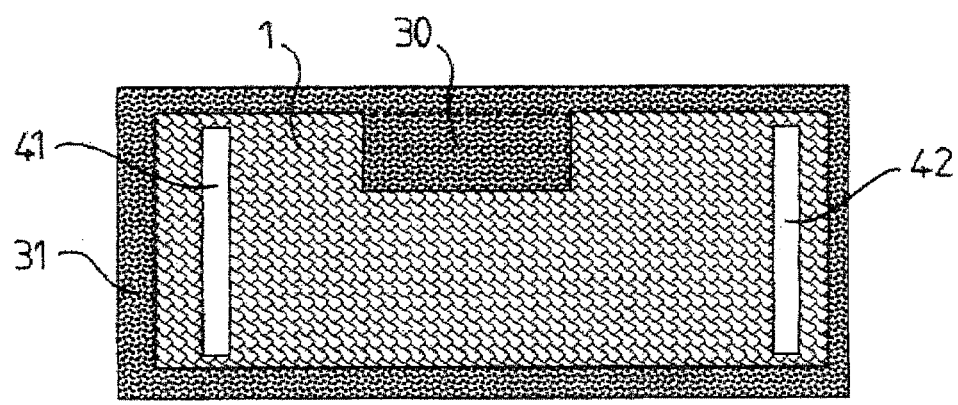
FIG. 3c schematically represents a front view of the network mask according to the invention with two solid masking zones according to the invention and two zones free of masking according to the invention.

FIG. 3c schematically represents a front view of the network mask 1 according to the invention with two solid masking zones 30, 31 according to the invention and two zones free of masking 41, 42 according to the invention.

The first solid masking zone 30 is rectangular, on a longitudinal edge, for example centered. It makes it possible, for example, to produce a communication window in motor vehicle glazing or building glazing.

The second solid masking zone 31 (completely) surrounds the network mask, thus forming a peripheral frame ("demargination zone"). It makes it possible, for example, to prevent grounding and/or to protect the electroconductive grid from corrosion.

This avoids producing a demargination of a solid layer.

Each solid zone may be produced by depositing a solution of polymeric nanoparticles, by formation of a water-soluble film, by formation of a peelable film, by deposition of a loaded paste, as illustrated previously.

The two zones free of masking 41, 42 are in the form of two peripheral parallel strips, on the lateral edges, this with a view to producing connection system (current lead commonly known as a busbar) zones.

Alternatively, it is possible to form busbars by additional deposition on the grid, for example by screen printing a silver paste and/or by depositing a solid/filled mask in these zones and additional deposition.

Figure 3D:
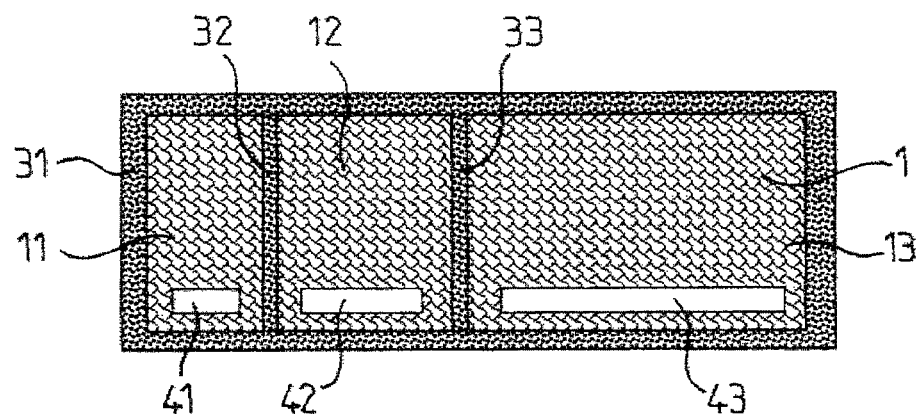
FIG. 3d schematically represents a front view of the network mask according to the invention with three solid masking zones according to the invention and with three zones free of masking according to the invention.

FIG. 3*d* schematically represents a front view of the network mask 1 according to the invention with three solid masking zones 31 to 33 according to the invention and with three zones free of masking 41 to 43 according to the invention.

The first solid masking zone 31 completely surrounds the network mask, thus forming a peripheral frame ("demargination zone"). It makes it possible, for example, to avoid grounding and/or to protect the electroconductive grid from corrosion. This also avoids producing a demargination of a solid layer.

The second and third solid masking zones 32, 33 are in the form of two parallel strips that separate the network mask into three regions 11 to 13.

The three zones free of masking 41, 42, 43 are in the form of peripheral strips, for example along the same longitudinal edge, this with a view to producing connection system (current lead commonly known as a busbar) zones for the electroconductive grid formed in the network mask zone.

It is thus possible to manufacture, for example, an electrochromic device with, in each of the regions, an active material of variable color. The electroconductive grid forms an electrode.

Figure 3E:
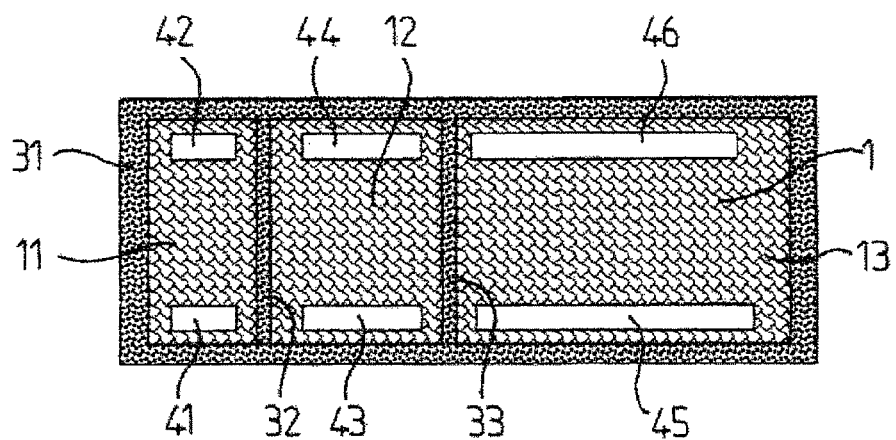
FIG. 3e schematically represents a front view of the network mask according to the invention with three solid masking zones according to the invention and with six zones free of masking according to the invention.

FIG. 3*e* schematically represents a front view of the network mask according to the invention with three solid masking zones according to the invention 31, 32, 33 and with six zones free of masking according to the invention.

The first solid masking zone 31 completely surrounds the network mask, thus forming a peripheral frame ("demargination zone"). It makes it possible, for example, to prevent grounding and/or to protect the electroconductive grid from corrosion. This also avoids producing a demargination of a solid layer.

The second and third solid masking zones 32, 33 are in the form of two parallel strips separating the network mask 1 into three regions 11 to 13.

The six zones free of masking 41 to 46 are in the form of two series of three parallel peripheral strips, for example along the two longitudinal edges, this with a view to producing connection system (current lead commonly known as a busbar) zones for the electroconductive grid formed in the network mask zone.

It is thus possible to manufacture, for example, a heating device (radiator or anti-condensation glazing). The electroconductive grid forms a heating grid.

Figure 3F:
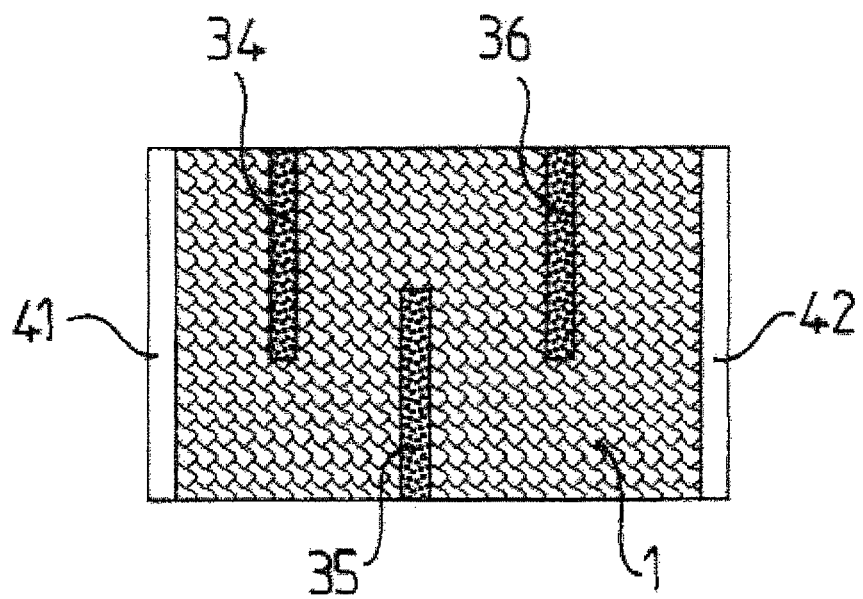
FIG. 3f schematically represents a front view of the network mask according to the invention with three solid masking zones according to the invention and with two zones free of masking according to the invention.

FIG. 3*f* schematically represents a front view of the network mask 1 according to the invention with three solid masking zones 34 to 36 according to the invention and with two zones free of masking 41, 42 according to the invention.

The two zones free of masking 41, 42 are in the form of two peripheral parallel strips, on the lateral edges, this with a view to producing connection system (current lead commonly known as a busbar) zones for the electroconductive grid formed in the network mask zone.

The three solid masking zones 34, 35, 36 are in the form of parallel strips that partially interrupt the network mask 1.

This makes it possible, in a heating device, to modify the heating parameters by modifying the path of the current. The electroconductive grid forms a heating grid.

Each solid zone can be produced by depositing a solution of polymeric nanoparticles, by formation of a water-soluble film, by formation of a peelable film, by depositing a loaded paste, as illustrated previously.

For fine solid zones (for example of the order of 100 microns), the formation of a water-soluble film by screen printing is for example preferred.

Figure 3G:
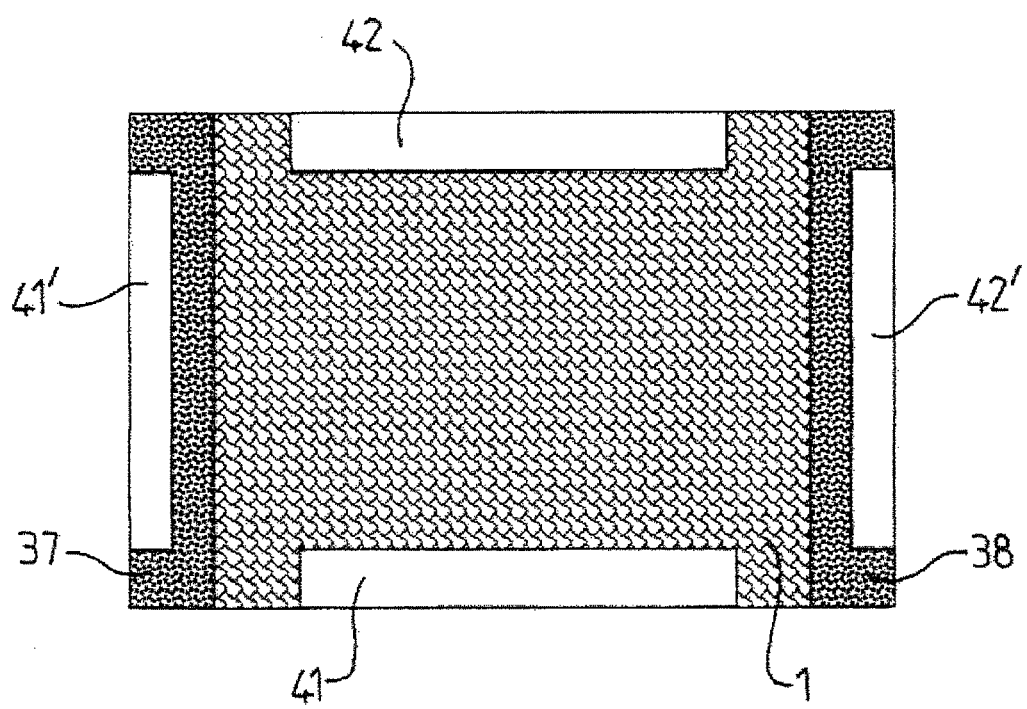
FIG. 3g schematically represents a front view of the network mask according to the invention with two solid masking zones according to the invention and with four zones free of masking according to the invention.

FIG. 3*g* schematically represents a front view of the network mask 1 according to the invention with two solid masking zones according to the invention 37, 38 and with four zones free of masking according to the invention 41, 41', 42, 42'.

Two zones free of masking 41, 42 are in the form of two parallel peripheral strips, for example along the longitudinal edges, this with a view to producing connection system (current lead commonly known as a busbar) zones for the electroconductive grid formed in the network mask zone.

Two other zones free of masking 41', 42' are in the form of two parallel peripheral strips, for example along the longitudinal edges, this with a view to producing connection system (current lead commonly known as a busbar) zones for an upper electrode.

Each solid zone may be produced by depositing a solution of polymeric nanoparticles, by forming a water-soluble film, by forming a peelable film, by depositing a loaded paste, as illustrated previously.

For fine solid zones 37, 38 (for example of the order of 500 µm or less), it is possible, for example, to deposit the solution of polymeric nanoparticles on the two edges, and to carry out a laser attack of these zones (partial removal) in order to form the zones free of masking 41', 42'.

These two zones free of masking 41', 42° are insulated from the network mask zone 1 by the two solid masking zones 37, 38.

The electroconductive grid may then form an electrode of an OLED device.

Grid Manufacture

After the partial removal of the mask, an electroconductive grid 5 (preferably with at least its connection system zone or zones) is produced by electroconductive deposition.

In order to do this, an electrically conductive material is deposited on the zone free of masking and through the mask 1, until the openings 10 are partially filled.

The material is chosen from electrically conductive materials such as aluminum, silver, copper, nickel, chromium, alloys of these metals, conductive oxides especially chosen from ITO, IZO, ZnO:Al; ZnO:Ga; ZnO:B; $SnO_2$:F; and $SnO_2$:Sb.

This deposition phase may be carried out, for example, by magnetron sputtering or by vapor deposition. The material is deposited inside the network of openings so as to fill the openings, the filling being carried out to a thickness for example of around half the height of the mask.

In order to reveal the grid structure from the network mask and to remove the solid or filled masking layer, a "lift off" operation is carried out. This operation is facilitated by the fact that the cohesion of the nanoparticles results from weak van der Waals type forces (no binder, or bonding resulting from annealing).

The substrate is then immersed in a solution containing water and acetone (the cleaning solution is chosen as a function of the nature of the nanoparticles), then rinsed so as to remove all the parts coated with nanoparticles. The phenomenon can be accelerated due to the use of ultrasound to degrade the masks of nanoparticles and reveal the complementary parts (the network of openings filled by the material), which will form the grid and the functional empty parts.

Figure 4:
FIG. 4 represents an electroconductive grid according to the invention as a top view.

Represented in FIG. 4 is a photograph, obtained using SEM, of an electroconductive grid 5 with its strands 50 thus obtained.

Given below are the electrical and optical characteristics obtained for aluminum-based grids.

|  | Rotational speed (rpm) | | | | | | | |
|---|---|---|---|---|---|---|---|---|
|  | 200 | | 400 | | 700 | | 1000 | |
|  | Al thickness (nm) | | | | | | | |
|  | 300 | 1000 | 300 | 1000 | 300 | 1000 | 300 | 1000 |
| Sheet R (Ω/□) | 2.1 | 0.65 | 2.4 | 0.7 | 3 | 0.9 | 3.1 | 0.95 |
| % $T_L$ | 79.8 | 79.3 | 81.9 | 82.1 | 83.2 | 83.1 | 84.9 | 83.9 |
| % $R_L$ | 14.7 | 15.0 | 14.6 | 14.2 | 13.1 | 12.4 | 11.7 | 11.6 |

Due to this particular grid structure, it is possible to obtain, at a lower cost, an electrode that is compatible with electrically controllable systems while having high electrical conductivity properties.

Figure 7:
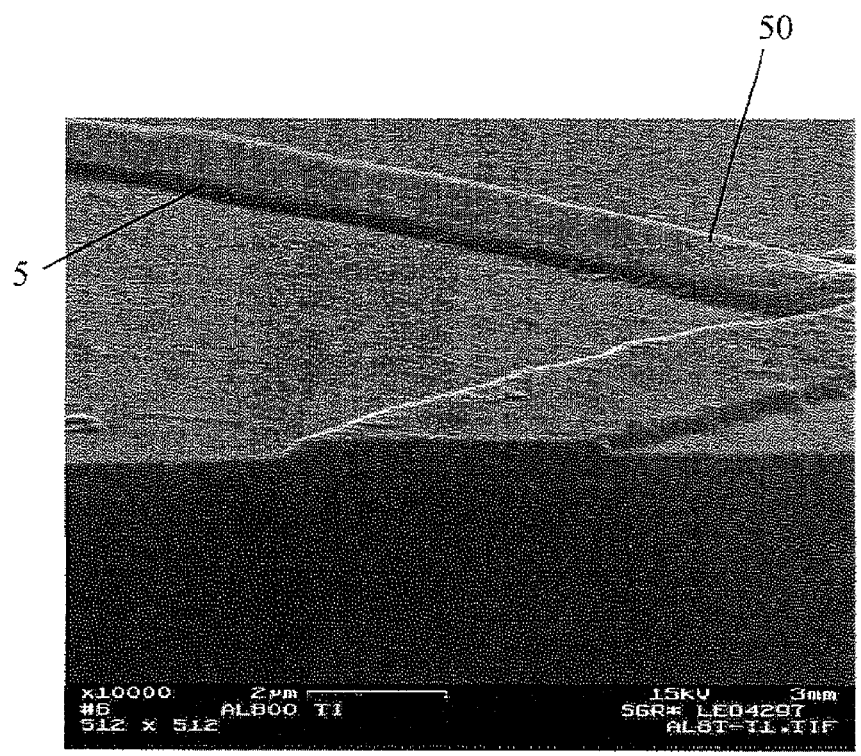
FIGS. 7 and 8 represent partial SEM views of an electroconductive grid according to the invention.
Figure 8:
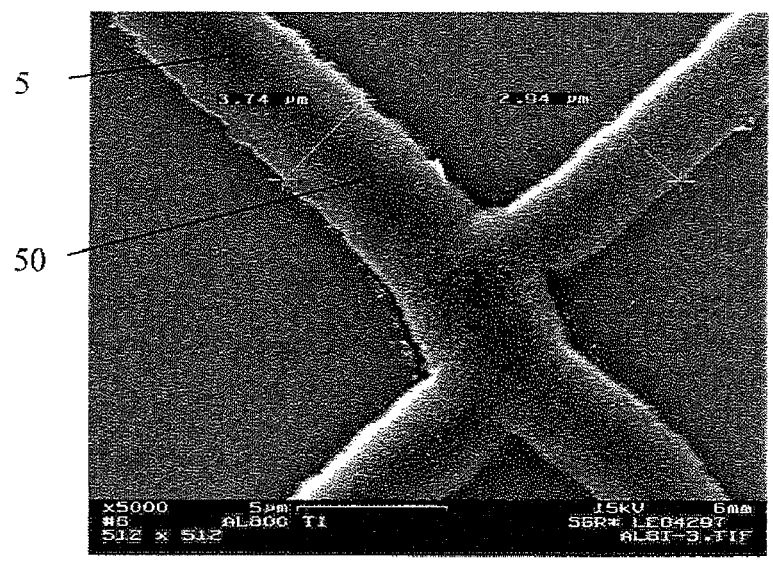

FIGS. 7 and 8 show SEM detailed top (perspective) views of the strands of a grid 5 made of aluminum. It is observed that the strands 50 have relatively smooth and parallel edges.

The electrode incorporating the grid 5 according to the invention has an electrical resistivity between 0.1 and 30 ohm/square and an LT of 70 to 86%, which makes its use as a transparent electrode completely satisfactory.

Preferably, especially to achieve this level of resistivity, the metal grid has a total thickness between 100 nm and 5 μm.

In these thickness ranges, the electrode remains transparent, that is to say that it has a low light absorption in the visible range, even in the presence of the grid (its network is almost invisible owing to its dimensions).

The grid has an aperiodic or random structure in at least one direction that makes it possible to avoid diffractive phenomena and results in 15 to 25% light occultation.

For example, a grid 5 as represented in FIG. 4 having metal strands 50 that have a width of 700 nm and are spaced 10 μm apart gives a substrate a light transmission of 80% compared with a light transmission of 92% when bare.

Another advantage of this embodiment consists in that it is possible to adjust the haze value in reflection of the grids.

For example, for an inter-strand spacing (dimension B') of less than 15 μm, the haze value is around 4 to 5%.

For a spacing of 100 μm, the haze value is less than 1%, with B'/A' being constant.

For a strand spacing (B') of around 5 μm and a strand size A' of 0.3 μm, a haze of around 20% is obtained. Beyond a haze value of 5%, it is possible to use this phenomenon as a means for removing light at the interfaces or a means of trapping light.

Before depositing the mask material, it is possible to deposit, in particular by vacuum deposition, a sublayer that promotes the adhesion of the grid material.

Figure 9:
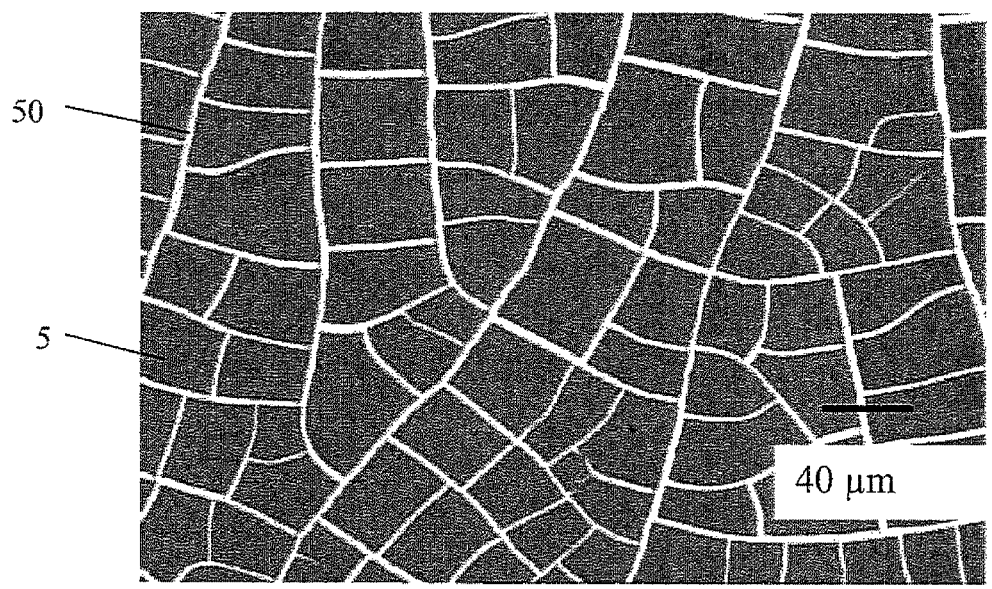
FIGS. 9 and 10 represent partial top views of electroconductive grids according to the invention.

For example, nickel is deposited and, as the grid material, aluminum. This grid is shown in FIG. 9.

For example, ITO, NiCr or else Ti is deposited and, as grid material, silver.

In order to increase the thickness of the metal layer and thus reduce the electrical resistance of the grid a copper overlayer has been deposited by electrolysis (soluble anode method) on the silver grid.

The glass covered with the adhesion-promoting sublayer and with the silver grid via magnetron sputtering constitutes the cathode of the experimental device; the anode is composed of a sheet of copper. It has the role, by dissolving, of keeping the concentration of $Cu^{2+}$ ions, and thus the deposition rate, constant throughout the deposition process.

The electrolysis solution (bath) is composed of an aqueous solution of copper sulfate ($CuSO_4.5H_2O=70$ $gl^{-1}$) to which 50 ml of sulfuric acid ($H_2SO_4$, 10N) are added. The temperature of the solution during the electrolysis is 23±2° C.

The deposition conditions are the following: voltage≤1.5 V and current≤1 A.

The anode and the cathode, spaced from 3 to 5 cm apart and of the same size, are positioned parallel in order to obtain perpendicular field lines.

Figure 10:
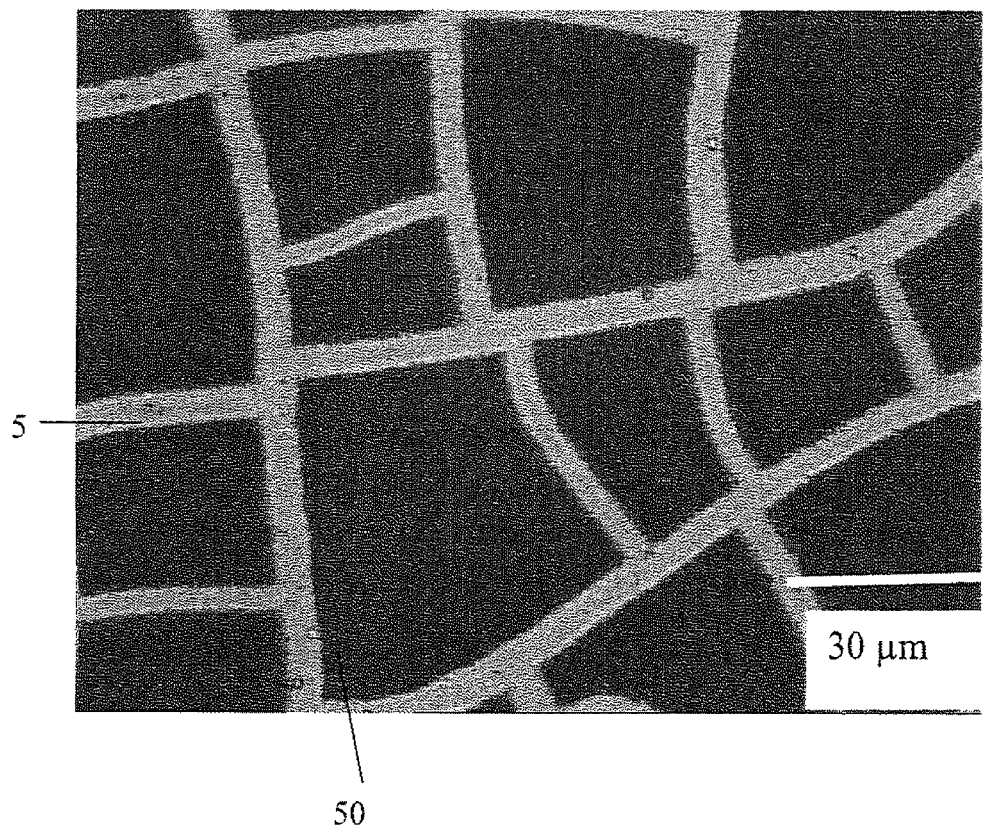

The layers of copper are homogeneous on the silver grids. The thickness of the deposition increases with the electrolysis time and the current density and also the morphology of the deposition. The results are shown in the table below and in FIG. 10.

| Sample | Reference 500 nm Ag | With 0.5 μm Cu | With 1 μm Cu |
|---|---|---|---|
| $T_L$ (%) | 75 | 70 | 66-70 |
| Haze (%) | 2.5 | 3.0 | 3.0 |
| Sheet R (Ω) | 3 | 2 | 0.2 |

The SEM observations made on these grids show that the size of the meshes B' is 30 μm±10 μm and the size of the strands A' is between 2 and 5 μm.

Figure 11:
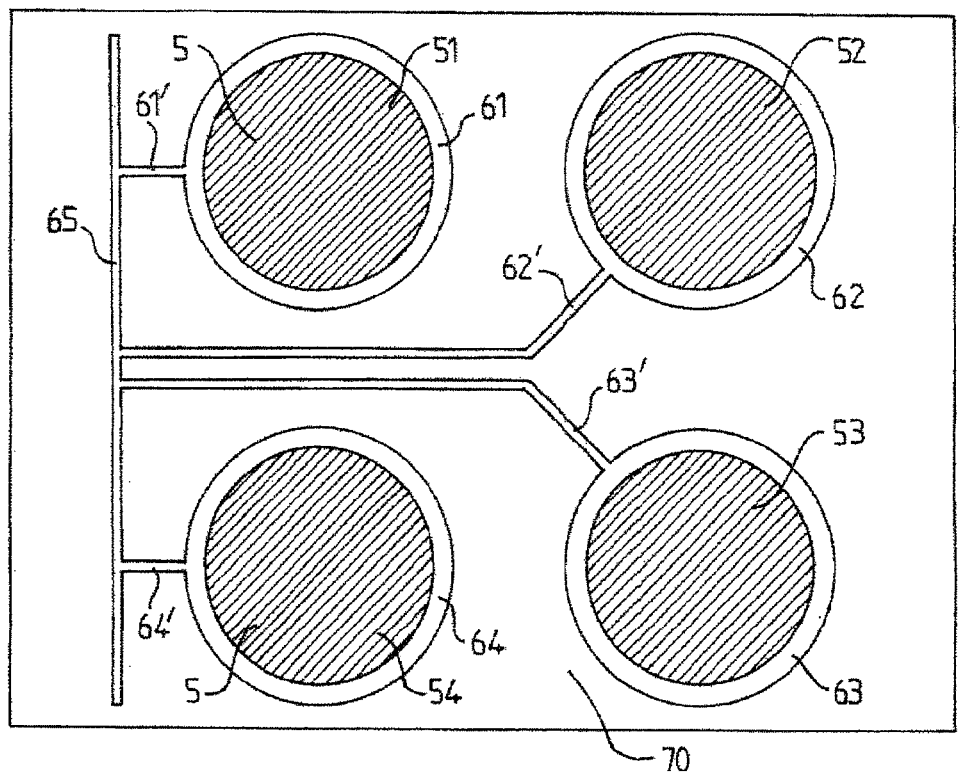
FIGS. 11 and 12 schematically represent electroconductive grids according to the invention as top views.
Figure 12:
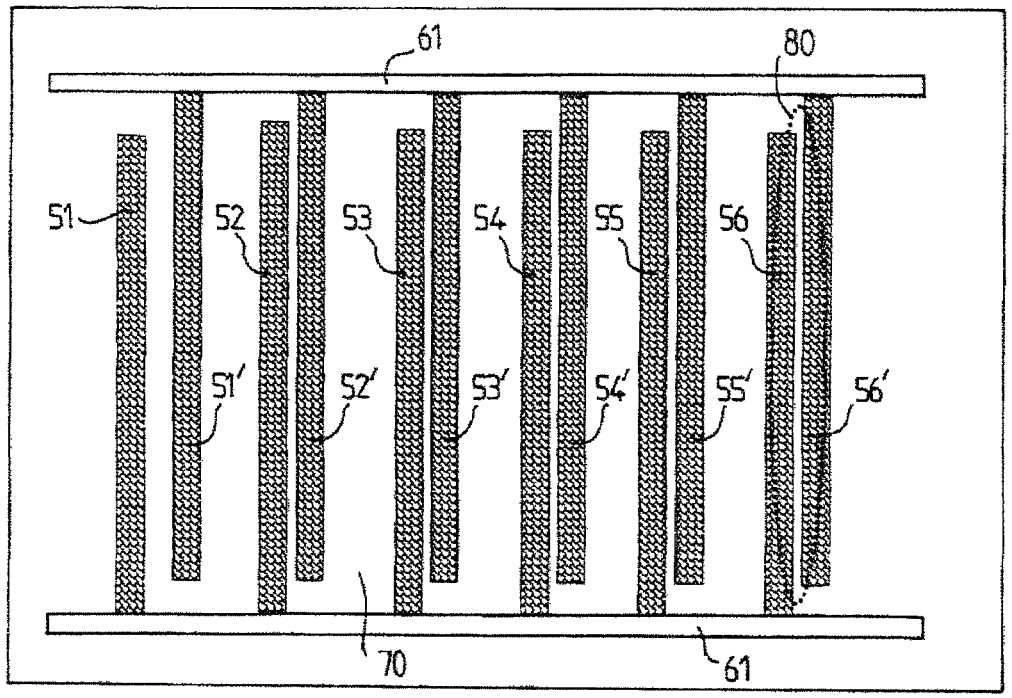

FIGS. 11 and 12 schematically represent top views of electroconductive grids 5 according to the invention.

In FIG. 11, the grid zone is divided into four separate round regions 51 to 54. Each of the regions is surrounded by an annular solid connection zone 61 to 64, for example made by removing the network mask before depositing the grid material.

Each annular connection zone is connected to a connection track 61' to 64' leading to a peripheral common track 65.

Between the annular connection zones, the substrate 2 is devoid of electroconductive material, forming an electrically insulating zone 70. This has for example been achieved by filling, in this zone, the network mask deposited over the entire surface.

In FIG. 12, the grid zone 5 is divided into six groups of electrodes 51 to 56': anode and cathode.

The anodes 51 to 56 are connected to a first peripheral busbar 61, for example made by removing the network mask before depositing the grid material.

The cathodes 51' to 56' are connected to a second peripheral busbar 62, for example made by removing the network mask before depositing the grid material.

The discharge space 80 between each anode 51 to 56 and respective cathode 51' to 56' is confined.

Between the electrodes, the substrate 2 is devoid of electroconductive material, forming an electrically insulating zone 70. This has for example been achieved by filling, in this zone, the network mask deposited over the entire surface.

The invention claimed is:

1. A process for manufacturing a mask having submillimetric openings, the mask produced on a main face of a substrate by deposition of a liquid masking layer as a solution and drying, the process comprising:

depositing a first solution of colloidal nanoparticles stabilized and dispersed in a first solvent to form a first masking layer, the nanoparticles having a glass transition temperature $T_g$;

drying the first masking layer at a temperature below said temperature $T_g$ until a network mask having a two-dimensional network of submillimetric openings is obtained with substantially straight mask area edges, the network mask being in a network mask zone, wherein the process comprises forming a solid mask zone via a liquid deposition, on the face, of a second masking layer, the solid mask zone being adjacent to and in contact with the network mask zone, and/or the process comprises forming at least one cover zone via the placement of at least one cover on the face, the cover zone being in contact with the network mask zone, and/or after the drying of the first masking layer, the process comprises forming a filled mask zone via the liquid filling of the openings of a portion of the network mask zone, wherein the solid mask zone, the cover zone and the filled mask zone each define an electrically insulating zone in which a deposition of an electroconductive material is prevented in said electrically insulating zone, said deposition of the electroconductive material to fill said submillimetric openings in the network mask zone.

2. The process for manufacturing a mask having submillimetric openings as claimed in claim 1, wherein the drying of the first masking layer is carried out at a temperature below 50° C.

3. The process for manufacturing a mask having submillimetric openings as claimed in claim 1, wherein the solvent of the first solution is aqueous and the nanoparticles are polymeric and/or comprises inorganic nanoparticles.

4. The process for manufacturing a mask having submillimetric openings as claimed in claim 1, wherein the second masking layer deposited via a liquid route and/or the filled zone are dried at a temperature below 50° C.

5. The process for manufacturing a mask having submillimetric openings as claimed in claim 1, wherein for the formation of the solid zone via a liquid route or of the filled mask zone, a second solution comprising colloidal nanoparticles that are stabilized and dispersed is deposited, the nanoparticles having a given glass transition temperature $T_g$ and the second masking layer or the filled zone being dried at a temperature above said temperature $T_g$.

6. The process for manufacturing a mask having submillimetric openings as claimed in claim 5, wherein the glass transition temperature $T_g$ of the or each polymer of the second solution is less than or equal to 30° C.

7. The process for manufacturing a mask having submillimetric openings as claimed in claim 5, wherein the second solution comprises polymeric nanoparticles, and/or comprises nanoparticles that are inorganic.

8. The process for manufacturing a mask having submillimetric openings as claimed in claim 1, wherein for the formation of the solid zone or of the filled mask zone, a paste loaded with micron-scale non-consolidated inorganic particles is deposited and is not consolidated via a thermal treatment.

9. The process for manufacturing a mask having submillimetric openings as claimed in claim 1, wherein, for the formation of the solid zone, a peelable adhesive polymer film is formed, or a soluble polymer film is formed by deposition, after the formation of the network mask, of an aqueous solution of dissolved polymers, said soluble polymeric film then being removed by washing with an aqueous solution.

10. The process for manufacturing a mask having submillimetric openings as claimed in claim 1, wherein for the formation of the filled zone, a polymeric solution of dissolved polymers is deposited through the openings, the filled mask then being removed by washing with an aqueous solution, said first solution then being chosen to be aqueous.

11. The process for manufacturing a mask having submillimetric openings as claimed in claim 1, wherein the cover or covers are placed on the network mask.

12. The process for manufacturing a mask having submillimetric openings as claimed in claim 1, wherein the deposition of the second masking layer or of the filling layer or else the cover separates the network mask zone into at least two regions.

13. The process for manufacturing a mask having submillimetric openings as claimed in claim 1, comprising forming a zone free of masking on said face by mechanical and/or optical removal of at least one peripheral portion of the network mask zone, which is optionally the filling zone and/or by partial mechanical and/or optical removal of at least one solid or filled mask zone.

14. The process for manufacturing a mask having submillimetric openings as claimed in claim 13, wherein the deposition of the second masking layer or of the filling layer or the cover separates the network mask zone and the zone free of masking.

15. The process for manufacturing a mask having submillimetric openings as claimed in claim 5, wherein the shape and the size of the nanoparticles of the first solution and/or where appropriate of the second solution or of a filling solution to form the filled mask zone are not substantially modified by the drying.

16. The process for manufacturing a mask having submillimetric openings as claimed in claim 3, wherein the nanoparticles are acrylic copolymers, polystyrenes, poly(meth)acrylates, polyesters or blends thereof.

17. The process for manufacturing a mask having submillimetric openings as claimed in claim 3, wherein the inorganic nanoparticles are made of silica, alumina or iron oxide.

18. The process for manufacturing a mask having submillimetric openings as claimed in claim 5, wherein the colloidal nanoparticles of the second solution are stabilized and dispersed in an aqueous solvent.

19. The process for manufacturing a mask having submillimetric openings as claimed in claim 1, wherein the solid mask zone is formed prior to depositing the first solution of colloidal nanoparticles.

20. A process for manufacturing a mask having submillimetric openings, the mask produced on a main face of a substrate by deposition of a liquid masking layer and drying, the process comprising:

depositing a first solution of colloidal nanoparticles stabilized and dispersed in a first solvent over the substrate to form a first masking layer;

drying the first masking layer at a temperature below a glass transition temperature of the nanoparticles until a network mask having a two-dimensional network of submillimetric openings is obtained, the network mask being in a network mask zone;

forming an electrically insulating zone in which a deposition of an electroconductive material is prevented in said electrically insulating zone, said deposition of the electroconductive material to fill said submillimetric openings in the network mask zone, the forming comprising forming a solid mask zone via a liquid deposition, on the face, of a second masking layer, the solid mask zone being adjacent to and in contact with the network mask zone, and/or forming a cover zone via the placement of a cover on the face, the cover zone being in contact with the network mask zone, and/or after drying the first masking layer, forming a filled mask zone via liquid filling of the openings of a portion of the network mask zone; and removing part of the network mask zone to define a zone free of masking.

21. The process for manufacturing a mask having submillimetric openings as claimed in claim 20, wherein the drying of the first masking layer is carried out at a temperature below 50° C.

22. The process for manufacturing a mask having submillimetric openings as claimed in claim 20, wherein the solvent of the first solution is aqueous and the nanoparticles are polymeric and/or comprises inorganic nanoparticles.

23. The process for manufacturing a mask having submillimetric openings as claimed in claim 20, wherein the solid mask zone is formed prior to depositing the first solution of colloidal nanoparticles.

* * * * *

UNITED STATES PATENT AND TRADEMARK OFFICE
CERTIFICATE OF CORRECTION

PATENT NO. : 8,697,186 B2  Page 1 of 1
APPLICATION NO. : 13/120292
DATED : April 15, 2014
INVENTOR(S) : Georges Zagdoun et al.

It is certified that error appears in the above-identified patent and that said Letters Patent is hereby corrected as shown below:

On title page, item (75) Inventors
replace "Georges Zagdoun, La Garenne Columbes (FR)"
with -- Georges Zagdoun, La Garenne Colombes (FR) --.

Signed and Sealed this
First Day of July, 2014

Michelle K. Lee
*Deputy Director of the United States Patent and Trademark Office*